United States Patent
Saeki

(10) Patent No.: US 7,187,727 B2
(45) Date of Patent: *Mar. 6, 2007

(54) CLOCK AND DATA RECOVERY CIRCUIT AND CLOCK CONTROL METHOD

(75) Inventor: Takanori Saeki, Tokyo (JP)

(73) Assignee: NEC Electronics Corporation (JP)

( * ) Notice: Subject to any disclaimer, the term of this patent is extended or adjusted under 35 U.S.C. 154(b) by 958 days.

This patent is subject to a terminal disclaimer.

(21) Appl. No.: 10/022,551

(22) Filed: Dec. 17, 2001

(65) Prior Publication Data

US 2002/0079938 A1 Jun. 27, 2002

(30) Foreign Application Priority Data

Dec. 21, 2000 (JP) .............................. 2000-389526

(51) Int. Cl.
H03D 3/18 (2006.01)
H03D 3/24 (2006.01)

(52) U.S. Cl. ...................... 375/327; 375/324; 327/156; 329/307; 329/325; 329/360

(58) Field of Classification Search ................ 375/371, 375/373–376, 327; 327/158, 161, 164–167; 331/135

See application file for complete search history.

(56) References Cited

U.S. PATENT DOCUMENTS

| | | | | |
|---|---|---|---|---|
| 5,920,494 | A | * | 7/1999 | Setbacken et al. .......... 708/290 |
| 6,285,726 | B1 | | 9/2001 | Gaudet ....................... 375/376 |
| 6,388,490 | B2 | | 5/2002 | Saeki .......................... 327/270 |
| 6,396,318 | B2 | | 5/2002 | Saeki .......................... 327/116 |
| 6,466,098 | B2 | * | 10/2002 | Pickering ..................... 331/25 |
| 6,753,712 | B2 | * | 6/2004 | Saeki .......................... 327/165 |
| 2001/0009384 | A1 | | 7/2001 | Saeki .......................... 317/113 |
| 2001/0035780 | A1 | | 11/2001 | Saeki .......................... 327/113 |

(Continued)

FOREIGN PATENT DOCUMENTS

DE 199 22 807 11/1999

(Continued)

OTHER PUBLICATIONS

Fiedler, A., "A 1.0625GHz Tranceiver with 2x-Oversampling and Transmit SIgnal Preemphasis", ISSCC 1997, pp 238-239.

(Continued)

Primary Examiner—Stephen Chin
Assistant Examiner—Erin M. File
(74) Attorney, Agent, or Firm—Hayes Soloway P.C.

(57) ABSTRACT

To provide a clock and data recovery circuit which facilitates alteration of the frequency range and adjustment of characteristics. The clock and data recovery circuit includes a phase shift circuit 101 having a switch receiving as inputs multi-phase clocks for selecting and outputting plural sets of the paired clocks from the input multi-phase clocks and a plural number of interpolators receiving the plural number of clock pairs output from the switch to output signals having the delay prescribed by the time corresponding to interior division of the phase difference of the clock pairs, a plural number of latch circuits 102 for latching the input data based on the signals output from the phase shift circuit 101, a counter 103 for counting the outputs of the plural latch circuits, a filter 105 for averaging the counter output over a preset time, a decoder 106 for decoding an output of the filter and a selection circuit 104 fed with a plural number of sets of data output by the plural latch circuits and clocks output from a preset one of the plural interpolators to select pairs of output data and clocks.

16 Claims, 16 Drawing Sheets

U.S. PATENT DOCUMENTS

2002/0041195 A1 4/2002 Saeki ............................ 327/113
2002/0085656 A1* 7/2002 Lee et al. ..................... 375/355

FOREIGN PATENT DOCUMENTS

| | | |
|---|---|---|
| DE | 100 09 039 | 10/2000 |
| JP | 2000-252802 | 9/2000 |
| TW | 85114730 | 11/1996 |

OTHER PUBLICATIONS

Sidiropoulos, S. et al, A semi-digital delay locked loop with unlimited phase shift capability and 0.008-400 MHz operating range:, ISSCC 1997, pps 332-333.

"A2BParallel 1.25 Gb/s Interconnect I/O interface with Self Configurable Link and Plesiochronous Clocking", ISSCC 1999, pps 180-181.

* cited by examiner

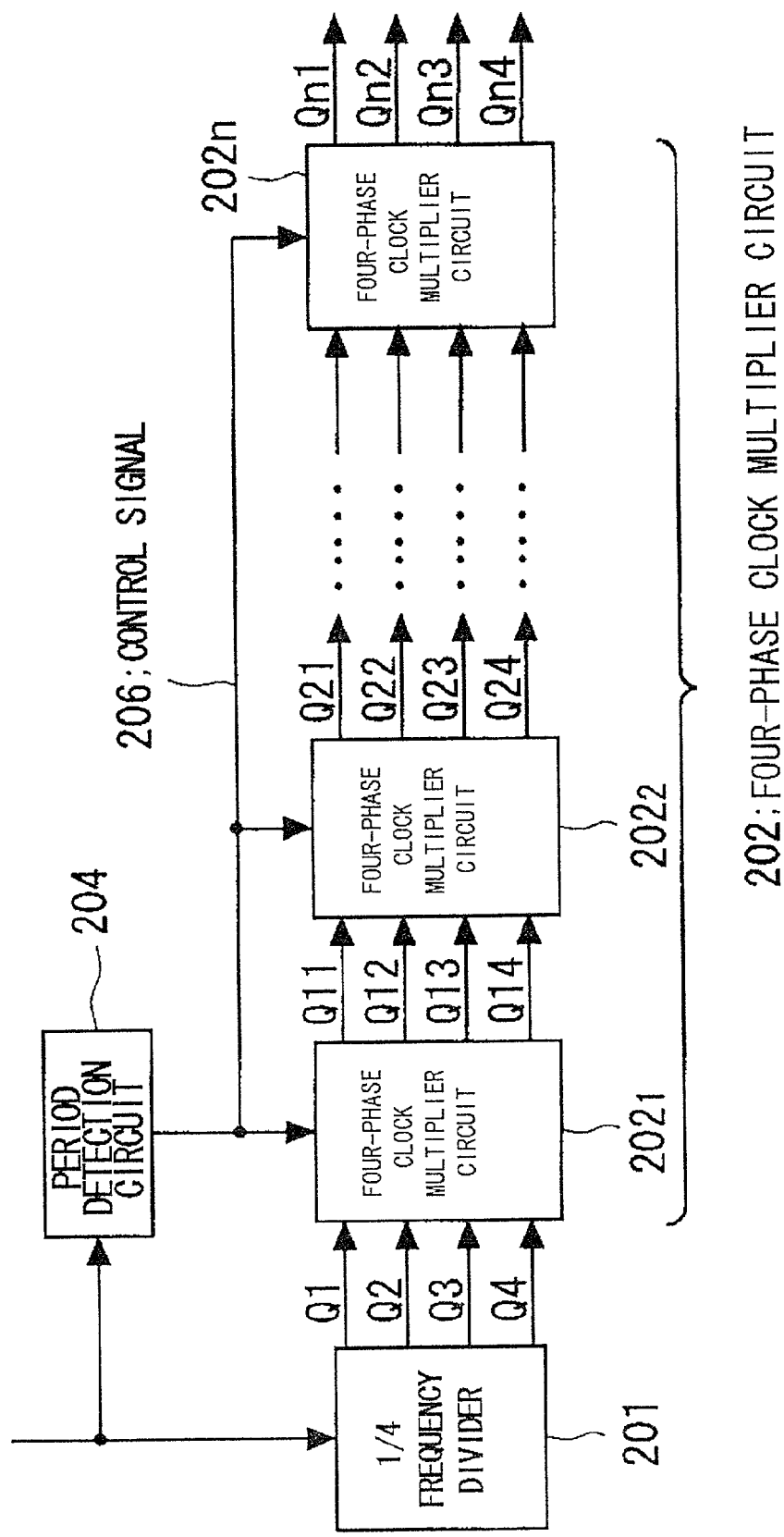

PULSE CORRECTION CIRCUIT

MULTIPLEXER CIRCUIT

T                    T/2

# CLOCK AND DATA RECOVERY CIRCUIT AND CLOCK CONTROL METHOD

FIELD OF THE INVENTION

This invention relates to a clock and data recovery method and a clock and data recovery circuit.

BACKGROUND OF THE INVENTION

FIG. 13 shows the structure of a conventional clock and data recovery circuit. From a reference clock (Ref CLK), multi-phase clocks (multiphase outputs), having an equally-spaced phase difference are generated by a voltage controlled oscillator (VCO) 51 of a phase locked loop (PLL). The VCO 51 is comprised of a ring oscillator of an analog circuit configuration, made up of an odd number of inverter circuits, connected in a ring topology. Multi-phase clocks with an equally spaced phase difference are output in a differential mode from differential inverter circuits of the respective stages making up the ring oscillator. An input data DATA is provided in common to data terminals of plural flip-flops 52 (F/F1 to F/F8) and respective multi-phase clock output from the VCO 51 are fed to clock terminals of the flip-flops 52 (F/F1 to F/F8) which sample the data DATA with rising or falling edges of clock signals and output the sampled data. The clock and data recovery circuit also includes a counter 53 which receives output data output from the plural flip-flops 52 (F/F1 to F/F8) to count up and down logic values of the output data, and a filter 55 which time-averages the output of the counter 53 over a preset time constant. An output voltage of the filter 55 is fed to the voltage-controlled oscillator (VCO) as its control voltage. Part or all of the outputs of the flip-flops 52 and one-phase clock output from the VCO 51 are output as data and clocks, respectively. The outputs of the plural flip-flops 52 (F/F1 to F/F8) are obtained on sampling the data DATA with clocks having phases shifted by a equal value and a sampling waveform which is equivalent to that of sampling the data with a frequency equal to eight times the frequency of the reference clock, is obtained, with the clock timing of a flip-flop, an output value of which does not coincide with the output value of the neighboring flip-flop representing a transition point of the data DATA.

If a clock has a delay with respect to the data transition point, that is if the latch timing is delayed, the count value of the counter 53 is incremented to advance the clock phase, whereas, if the clock leads with respect to the data transition point, the count value of the counter 53 is decremented to delay the clock phase with respect to the data transition point. Meanwhile, the counter 53 may be made up of a charge pump (CP) which charges a capacitor with constant current when the output values of the plural flip-flops 52 (F/F1 to F/F8) are of logic 0 and discharges the capacitor with the constant current when output values of the plural flip-flops 52 (F/F1 to F/F8) are of logic 1.

As a clock and data recovery circuit shown in FIG. 13, reference may be made to Publication 1 (ISSCC 1997 pp. 238 to 239 Alan Fiedler, "A. 1.0625 GHz Tranceiver with 2×—Oversampling and Transmit Signal Preemphasis"). The clock and data recovery circuit, disclosed in the Publication 1, includes a receiver circuit which recovers clocks and data from serial input data to output the recovered clocks and data as parallel data. The VCO (voltage controlled oscillator) of the PLL (phase locked loop) includes a ring oscillator having ten delay stages (10-delay-stage), and 20 clock phases of the VCO provides 2× oversampling clocks to the receiver circuit recovering the clocks and data. The receiver circuit makes the VCO to be locked in input data to recover clocks from the transition of data of NRZ (non-return-to-zero) waveform. Meanwhile, in the clock and data recovery circuit, disclosed in the Publication 1, a data phase detector is made up of a plural number of high-speed latches, and an exclusive-OR logic gate for detecting coincidence/non-coincidence of the high-speed latches. The latch for sampling data bits is clocked with a positive-phase clock of the VCO, while the latch for sampling the boundary between data bits is clocked with a reverse-phase clock of the VCO.

FIG. 14 shows a schematic view of a structure of a clock control circuit, comprised of the combination of a DLL (delay synchronization loop) and an interpolator, as disclosed in Publication 2 (ISSCC 1997 p.p. 332 to 333, S. Sidiropoulos and Mark Horowitz et al., "A semi-digital delay locked loop with unlimited phase shift capability and 0.08–400 MHz operating range"). Referring to FIG. 14, a DLL circuit 60 outputs multi-phase clocks P1 to Pn, synchronized with an input clock. These multi-phase clocks P1 to Pn are fed to a switch 20. Two neighboring signals, selected by the switch 20, are fed to the interpolator (phase interpolator) 30. A signal corresponding to the interior division of the input two signals by the interpolator 30 is output at an output OUT. A control circuit 40 variably controls the interior division ratio of the interpolator 30, based on the result of detection of the phase difference between the output OUT and the reference clock, while controlling the switching of the switch 20.

The interpolator 30 (phase interpolator) of FIG. 14 is made up of an analog circuit shown in FIG. 15. Referring to FIG. 15, this phase interpolator includes N-channel MOS transistors MN61, and MN62, forming a first differential pair, the sources of which are connected in common to a first constant current source CS1, the gates of which receive differentially clocks IN1 and IN1B, outputs pair of which are connected to one end of a first load (a common drain of P-channel MOS transistors MP61 and MP62 connected in parallel) and to one end of a second load (a common drain of P-channel MOS transistors MP63 and MP64 connected in parallel). The phase interpolator also includes N-channel MOS transistors MN63, and MN64, forming a second differential pair, the sources of which are connected in common to a second constant current source CS2, the gates of which receive differentially clocks IN2 and IN2B, outputs pair of which are connected to one end of a first load (a common drain of P-channel MOS transistors MP61 and MP62 connected in parallel) and to one end of a second load (a common drain of P-channel MOS transistors MP63 and MP64 connected in parallel). From the outputs pairs connected in common of the first and second differential pairs are output signals OUT and OUTB having the phases of the weighted sum of the two input clocks. In this phase interpolator, digital weight codes ict1 (16 bits of b[0] to b[15]) are fed to first and second constant current sources CS1 and CS2 to vary the current values of the first and second constant current sources CS1 and CS2, for conversion to the phase of the output clock. That is, the number of the constant current source transistors MN6B.sub.1 to MN6B.sub. 15 is selected by the turning on/off of the N-channel MOS transistors MN6A.sub. 1 to MN6A.sub.15, the gate terminals of which receive 16 bits b[0] to b[15], respectively, to vary the current value.

On the other hand, Publication 3 (155CC 1999 p.p. 180 to 181 "A2BParallel 1.25 Gb/s Interconnect I/O interface with Self Configurable Link and Plesiochronous Clocking") discloses a configuration, shown in FIG. 16, as a phase interpolator. Referring to FIG. 16, an output current of a current output type configuration which outputs an output current proportionate to the control circuit Ict1 is mirrored by a first current mirror circuit (MN74, and MN75), and the mirrored current is received by a second current mirror circuit (MN73, and MN74), an output mirror current of which is fed to a differential pair circuit which receives as inputs the differential clock inputs IN, and INB. The differential pair circuit is provided with the current from the constant current source transistor MN73 forming the second output end of the first current mirror circuit (MN74, and MN75) and clocks OUT, and OUTB, corresponding to phase shifted versions of the clocks IN, are output at the output nodes of the differential pair circuit. Meanwhile, the differential pair circuit includes N-channel MOS transistors MN71, and MN72, the sources of which are connected in common to a constant current source transistor MP73 and the gates of which are fed with differential clock pairs IN, and INB, and P-channel MOS transistors MP71, and MP72, the sources of which are connected in common to the drain of an output transistor MP74 of the second current mirror circuit, the gates of which are fed with differential clocks IN, and INB and the drains of which are connected to the drains of the N-channel MOS transistors MN71, and MN72. Outputs OUT, and OUTB are taken at the drains of the of the N-channel MOS transistors MN71, and MN72. Connecting the drains of the N-channel MOS transistors MN71, and MN72 and ground are capacitances C1, and C2, respectively, whereas, between the drains of the N-channel MOS transistors MN71, and MN72, transistors N-channel MOS transistors MN76 and MN77 are connected in series with each other. When the N-channel MOS transistors MN76 and MN77 are turned on, the outputs OUT, and OUTB are charged to an intermediate potential VDD.

In FIG. 16, when the clock IN makes a transition to a high level, the N-channel MOS transistor MN71 is turned on to turn the N-channel MOS transistor MN72 and the P-channel MOS transistor MN71 off and on, respectively to discharge the capacitor C1 while charging the capacitor C2 with the outputs OUT and OUTB making transitions to a low and high level, respectively. When the clock IN makes a transition to a low level, the N-channel MOS transistor MN71 is turned off to turn the N-channel MOS transistor MN72 and the P-channel MOS transistor MP72 on and off, respectively to charge the capacitor C1, while discharging the capacitor C2, with the outputs OUT and OUTB making transitions to a high and low level, respectively. So, the clock frequency band is variably controlled by the control signal Ict1 supplied to the digital analog converter (DAC).

As explained with reference to FIGS. 13 and 15, the above-described conventional circuit generates multi-phase clocks by the VCO circuit and, as an interpolator, a phase interpolator comprised of an analog circuit is adopted.

Moreover, as shown in FIG. 16, the analog phase interpolator has its band control being performed by the current which flows into the current source, such that, if a plural number of frequency bands are to be dealt with, such measures as widening the output current range of the constant current source is needed. In such case, it is not necessarily easy to compensate the linearity of the phase interpolator to enlarge the output current range of the constant current source.

SUMMARY OF THE DISCLOSURE

It is therefore an object of the present invention to provide a clock and data recovery circuit and a clock control method, which facilitate change of the frequency range and adjustment of characteristics.

It is another object of the present invention to provide a clock and data recovery circuit and a clock and a clock control method which make it possible to change the parallel number of data and clocks.

For accomplishing the above object, a clock and data recovery circuit in accordance with one aspect of the present invention, comprises a plural number of latch circuits receiving an input data in common for sampling the input data with transition edges of clocks having phases shifted from one another, said clocks supplied respectively to said latch circuits, and for outputting the sampled data; a phase detection circuit for detecting a phase of a transition point of said input data associated with the clocks from outputs of said plural latch circuits and for outputting the detected phase; a filter for smoothing an output of said phase detection circuit; and a circuit for controlling the phase of said clocks based on an output of said filter. The clock and data recovery circuit recovering the clocks and data based on the input data; wherein a circuit for supplying the clocks with phases shifted from one another to said plural number of latch circuits includes:

a switch, receiving a plural number of clocks having respective different phases(referred to as multi-phase clocks), for selecting a plural number of sets of clock pairs from said multi-phase clocks; and a plural number of interpolators, receiving plural sets of clock pairs, output from said switch, each interpolator outputting a signal the delay time of which is prescribed by the time corresponding to interior division of the phase difference of said clock pair;

each of said interpolators including:

a circuit for turning a charging path and a discharging path of a capacitor on and off depending on logic values of input clock pairs; and a buffer circuit for varying an output logic value when the magnitudes relation between the terminal voltage of said capacitor and a threshold value are inverted; the capacitance value of said capacitor being variably set by a control signal for determining the capacitance value; output signals of said plural interpolators being sent as clocks for said latch circuits; wherein a circuit for controlling the phase of said clocks includes a decoder for decoding an output of said filter;

switching of selection of said clock pairs in said switch is controlled based on an output signal of said decoder, the interior division ratio of said plural interpolators being variably set and control being performed to advance or delay the phase of clocks supplied to said plural latch circuits.

In accordance with the present invention, each of said interpolators includes a logic circuit having first and second input terminals for receiving first and second input signals therefrom;

a switch inserted across a first power supply and an internal node and turned on when an output of said logic circuit is of a first logic value; and a buffer circuit having its input terminal connected to said internal node and having an output logic value inverted on inversion of the magnitudes relation between said internal node voltage and a threshold value;

there being also provided N pieces of second switches connected in parallel, each having one end connected to said internal node, and having a control terminal supplied with said first input signal from said first input terminal;

N pieces of third switches connected in parallel, each having one end connected to said internal node, and having a control terminal supplied with said second input signal from said second input end;

N pieces of fourth switches, connected in parallel across the other end of said second switch and a second power supply and each having a control terminal supplied with a control signal from said decoder so as to be turned on or off;

N pieces of fifth switches, connected in parallel across the other end of said third switch and the second power supply and each having a control terminal supplied with a control signal from said decoder so as to be turned on or off; and a plural number of serial circuits inserted across said internal node and said second power supply and each being made up of a sixth switch and capacitor;

said sixth switch being turned on or off by a capacitance value determining control signal supplied to a control terminal of said sixth switch to variably control the value of the capacitance connected to said internal node.

In accordance with another aspect of the present invention, a clock control method for a clock and data recovery circuit including a plural number of latch circuits receiving input data in common; said latch circuits sampling the input data with transition edges of clock signals having phases shifted from one another, said clock signals supplied respectively to said latch circuits to output the sampled data;

a phase detection circuit for detecting a phase of a transition point of said input data associated with the clocks from outputs of said plural latch circuits and for outputting the detected phase;

a filter for smoothing an output of said phase detection circuit; and a circuit for controlling the phase of said clocks based on an output of said filter; said clock and data recovery method recovering the clocks and data based on the input data; comprising the steps of:

selecting by a switch receiving a plural number of clocks having respective different phases (termed multi-phase clocks), a plural number of sets of clock pairs from said multi-phase clocks and outputting the selected sets of the clock pairs;

with a plural number of interpolators receiving a plural number of sets of the clock pairs output form the switch, outputting a signal the delay time of which is prescribed by time corresponding to interior division of the phase difference of said paired clocks;

switching of selection of clock pairs in said switch being controlled based on an output signal of a decoder decoding the output of said filter; the interior division ratio of said interpolator being variably set to vary the phase of the clocks supplied to said plural latch circuits;

varying the capacitance value of each interpolator, having a circuit for turning a charging path and a discharge path of a capacitor on and off, depending on the logic value of the input clock pair, and a buffer circuit for changing an output logic value when the magnitudes relation between the terminal voltage of said capacitor and the threshold value is changed, by a set of switches being turned on and off with capacitance determining control signals to enlarge the frequency range that can be coped with.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 8 shows a structure of a multi-phase clock generating circuit according to an embodiment of the present invention.

PREFERRED EMBODIMENTS OF THE INVENTION

Figure 1A:
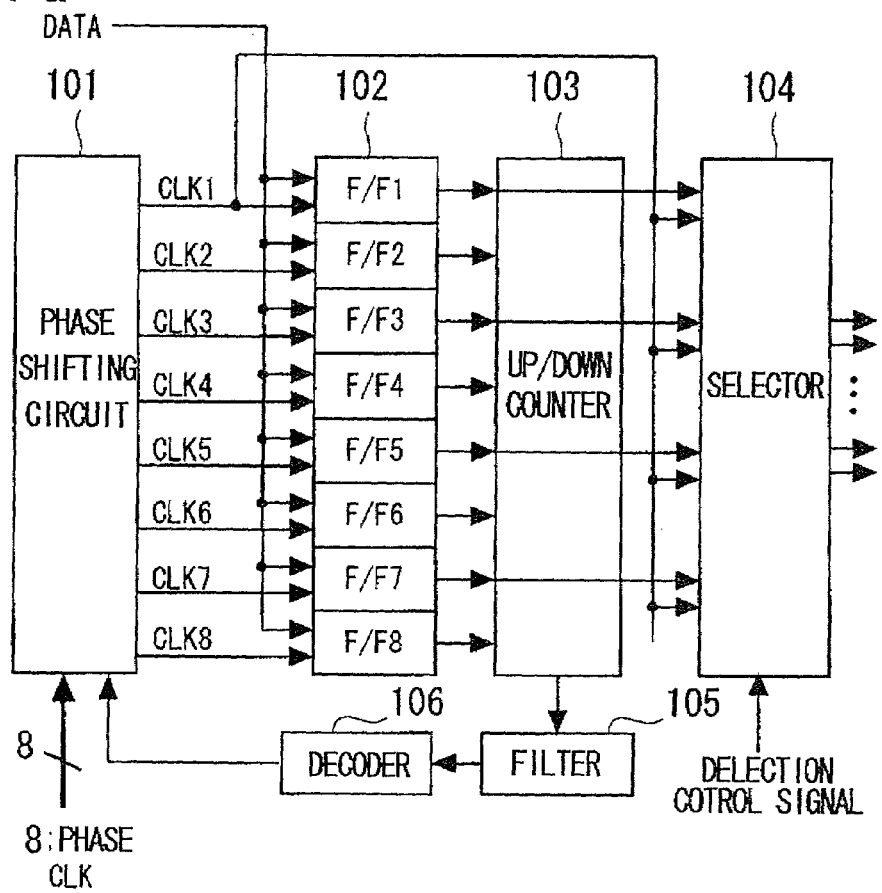
FIGS. 1a and 1b show a structure of an embodiment of the present invention.

Reference is made to the drawings for illustrating the embodiment of the present invention. A clock and data recovery circuit in accordance with the preferred embodiment of the present invention, shown in FIGS. 1a, 1b and 2, includes a phase shift circuit 10 which comprises a switch 110 for receiving plural clocks of respective different phases and outputting selectively a plural number of sets of paired clocks, and an interpolator 111 comprised of a plural number of interpolators 111 (INT1 to INT8), for receiving paired clocks output from the switch 110 and outputting output clocks the delay time of which is prescribed by the time obtained on dividing with a preset interior division ratio of the phase difference between the clock pairs. A clock and data recovery circuit in accordance with the preferred embodiment of the present invention further includes a plural number of latch circuits 102 (F/F1 to F/F8) for sampling input data with a rising edge or a falling edge of the clocks (CLK1 to CLK8) output from the plural interpolators, a counter 103 for up-counting or down-counting depending on whether the outputs of the plural latch circuits (F/F1 to F/F8) indicate up or down-counting, respectively, a filter 105 for time averaging the output of the counter 103 and a decoder 106 for decoding an output of the filter 105. The outline of the configuration and operation of the respective components are hereinafter explained.

Figure 4:
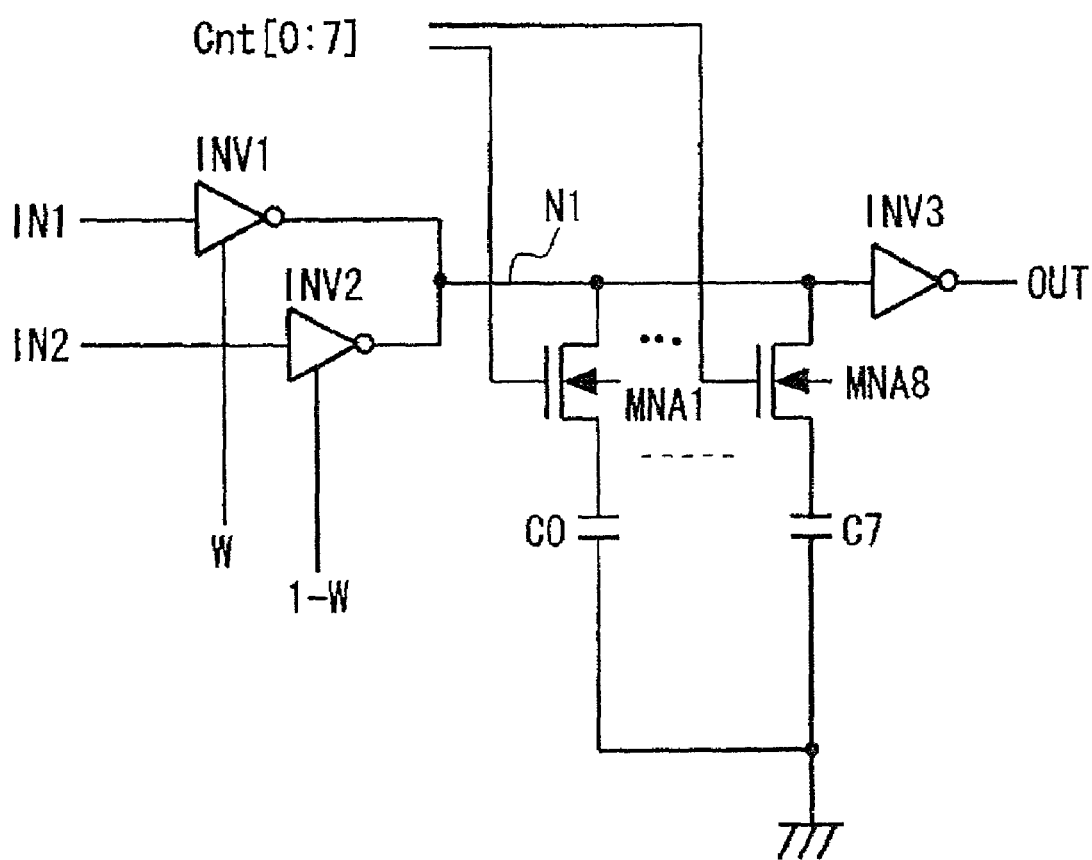
FIG. 4 shows the structure of an interpolator in a phase shifting circuit according to an embodiment of the present invention.

The interpolator 111 (INT1 to INT8) includes a circuit for turning a charging path and a discharge path of a capacitor on or off depending on the value of the input clock pairs (CMOS type inverters INV1 and INV2, the delay of which is changed, as shown in FIG. 4), and a buffer circuit (INV3 of FIG. 4), for varying the output logic value when the magnitude relation between the capacitor terminal voltage and a threshold value is inverted. The interpolator 111 is configured for variably setting the phase of the output signal, and for variably setting the capacitance values of the capacitor by a set of switches (MNA1 to MNA8 of FIG. 4) on/off controlled by control signals for determining the capacitance value (Cnt of FIG. 4[0:7]), in order to cope with a wide frequency range.

The counter 103 may be constructed by a charge pump for turning the charging path on to charge the capacitor or turning the discharge path on to discharge the charge stored in the capacitor (equivalently adding or subtracting the stored charges) depending on the outputs of plural latch circuits (F/F1 to F/F8) 102. Alternatively, the counter 103 may be comprised of an up/down counter or an adder in a digital circuit configuration. The filter 105 is made up of a low pass filter of an analog circuit or a digital filter (averaging filter).

Based on a switching signal U, output from the decoder 106, the combinations of the paired clocks in the switch 110 are switched. Moreover, based on the control signal S output from the decoder 106, the interior division ratios of the plural interpolators are variably controlled to variably control the phase of the clock output from the plural interpolators 111.

In an embodiment of the present invention, sets of output data of the plural latch circuits 102 (flip-flops F/F1 to F/F8) and clocks, such as, for example, a first-phase clock, output from the phase shift circuit 101, are entered to a selector 104, from which an optional set is selectively output. The number of data and clocks output in parallel is rendered variable.

For further explaining the above-described embodiment of the present invention in detail, a preferred embodiment of the present invention is now explained. FIG. 1a shows the structure of an embodiment of the present invention. Referring to FIG. 1a, a clock and data recovery circuit in accordance with one embodiment of the present invention includes a phase shift circuit 101, which receives eight-phase clocks and is adapted for outputting eight sets of clocks having phases being shifted, a plural number of D-type flip-flops 102 (F/F1 to F/F8), which receive at clock input terminals thereof the clock signal output from a phase shift circuit 101, receive input data DATA at data input terminals thereof and are adapted for sampling input data DATA with the rising edge of the clock, a counter 103 for upcounting and downcounting a count value in case of the output of the plural D-type flip-flops 102 being at logic 0 or at logic 1, respectively, a filter 105 for time averaging the output of the counter 103, a decoder 106 for decoding the output of the filter 105, and a selector (selection circuit) 104 receiving one-phase clock output from phase shift circuit 101 and output data of the plural D-type flip-flops 102 (F/F1 to F/F8) to output selected sets (one-phase clock and sampled output data) in parallel based on the selection control signal. In FIG. 1a, the selector 104 receives outputs of D-type flip-flops F/F1, F/F3, F/F5 and F/F7 as inputs among the plural D-type flip-flops (F/F1 to F/F8). Alternatively, outputs of all D-type flip-flops F/F1 to F/F8 may be fed to the selector 104. Alternatively, outputs of all D-type flip-flops F/F1 to F/F8 may be fed to the selector 104.

Figure 1B:
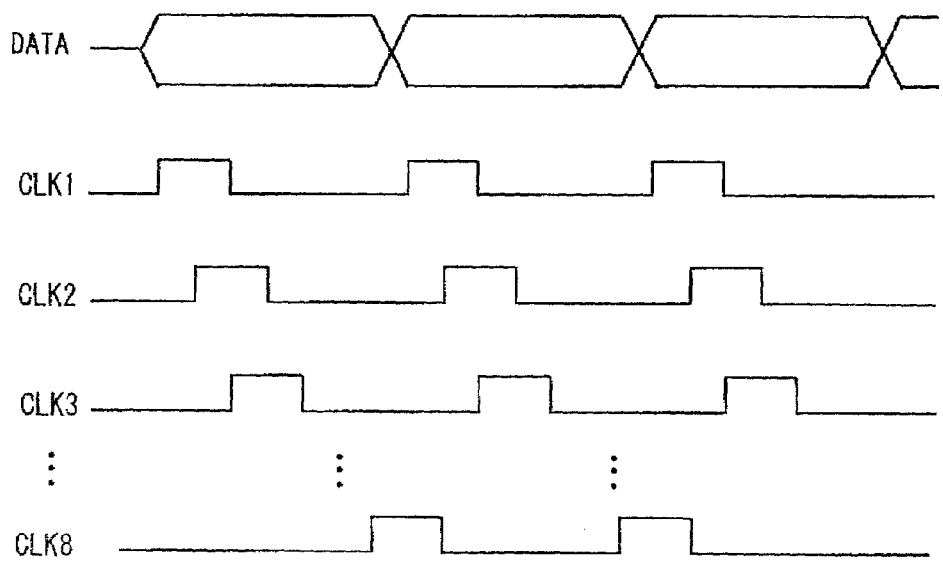

The D-type flip-flops 102 (F/F1 to F/F8) sample the input data DATA with the rising (or falling) edge of the clocks CLK1 to CLK8 output from the phase shift circuit 101 (see FIG. 1b). From an output of the plural D-type flip-flops 102 (F/F1 to F/F8), such as "00001111", there is obtained waveform data on sampling the input data at a sampling period corresponding to one-eighth of the clock period. The input data undergoes a transition at a change point of output values of neighboring D-type flip-flops 102. The counter 103 counts outputs of the plural Dtype flip-flops 102 and the resulting count values are smoothed by the filter 105 at a preset time constant to manage control as to whether or not the phase of clocks supplied to the plural D-type flip-flops is advanced or delayed, and hence clocks and data locked to the input data DATA are output.

Figure 2:
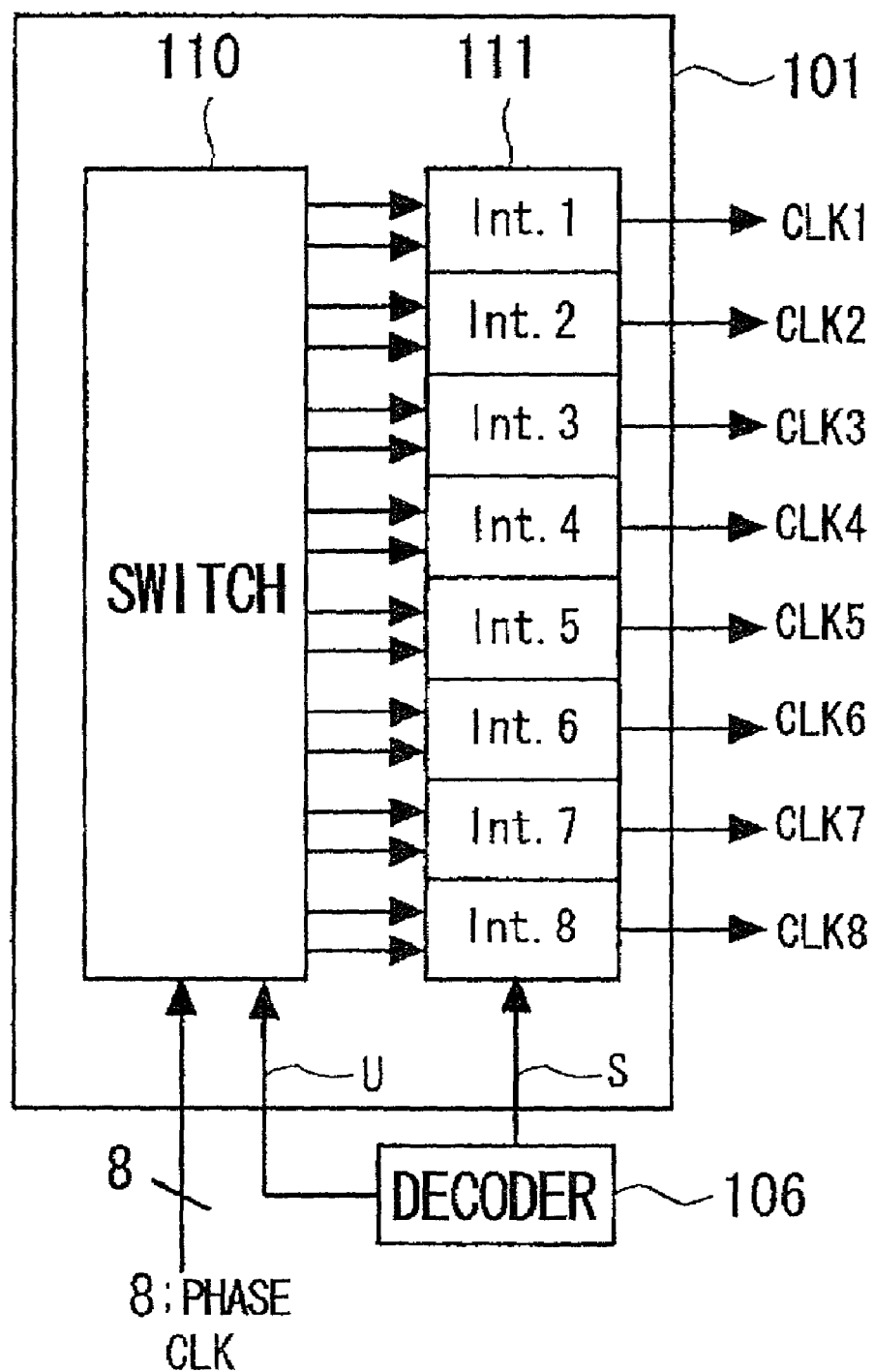
FIG. 2 shows the structure of a phase shift circuit according to an embodiment of the present invention.

FIG. 2 shows the structure of a phase shift circuit 101 in accordance with an embodiment of the present invention. Referring to FIG. 2, the phase shift circuit 101 includes a switch 110 fed with eight-phase clocks (8-phase CLK) and eight interpolators 111 (INT1 to INT8) fed with clock pairs output from the switch 110. The switch 110 is configured e.g., as a rotary switch and switches the combinations of output clock pairs based on outputs of the decoder circuit 106.

Figure 3:
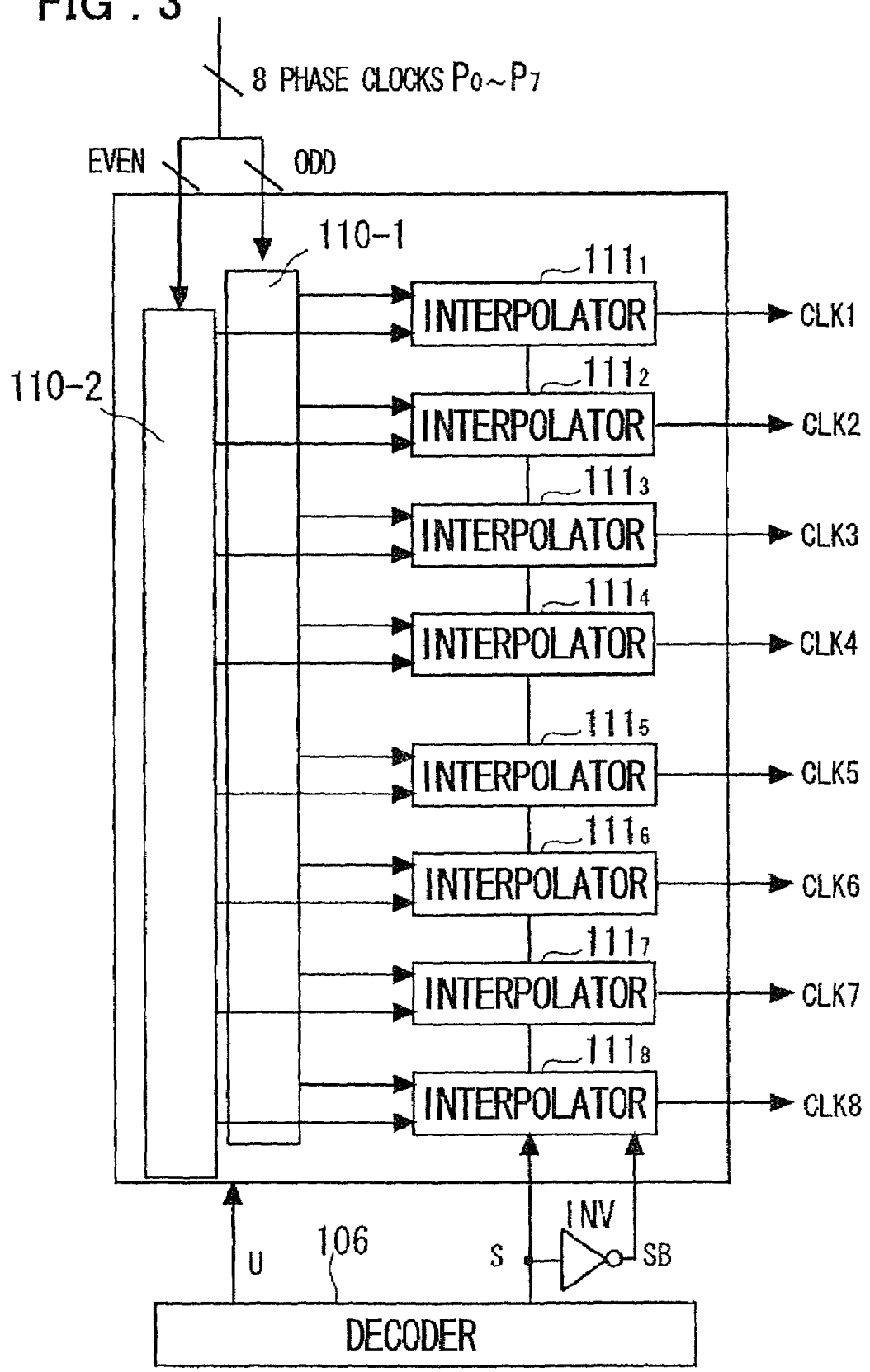
FIG. 3 shows the structure of a switch in a phase shift circuit of an embodiment of the present invention.

FIG. 3 shows an illustrative structure of the switch 110 (rotary switch) and the interpolator 111. Referring to FIG. 3, this rotary switch includes a first switch 110-1 fed with odd-phased clocks (P0, P2, P4 and P6) of the eight-phased clocks P0 to P7 to output clocks selectively to the interpolator 111, and a second switch 110-2 fed with even-phased clocks (P1, P3, P5 and P7) of the eight-phased clocks P0 to Pn to output clocks selectively to the interpolator 111. In the initial state, in which switching control by the decoder 106 is not made, clock pairs (P0, P1), (P1, P2), (P2, P3), (P3, P4), (P4, P5), (P5, P6), (P6, P7), and (P7, P0), output by the first switch 110-1 and the second switch 110-2, are input to the interpolators $111_1$ to $111_8$.

The decoder 106 provides control signals S, SB to the respective interpolators $111_1$ to $111_8$. If, when the interior division ratio (interior division ratio is w:1-w in FIG. 4 as later explained) of the phase difference of the interpolators $111_1$ to $111_8$ has reached upper or lower limit values, it is necessary to advance or delay further the phase, a switching signal U for switching the combinations of the clock pairs supplied to the interpolators $111_1$ to $111_8$ is output to the switches 110-1 and 110-2. For example, if the clock pair combinations (P0, P1), (P1, P2), (P2, P3), (P3, P4), (P4, P5), (P5, P6), (P6, P7), and (P7, P0) are fed to the interpolators $111_1$ to $111_8$, the clock pair combinations are switched to delay the clock phase, the clock pair combinations are switched to provide the combination of (P1, P2), (P2, P3), (P3, P4), (P4, P5), (P5, P6), (P6, P7), (P7, P0), and (P0, P1).

The switch 110 is termed a rotary switch because it circulates or rotates the clock pair combinations.

Figure 5:
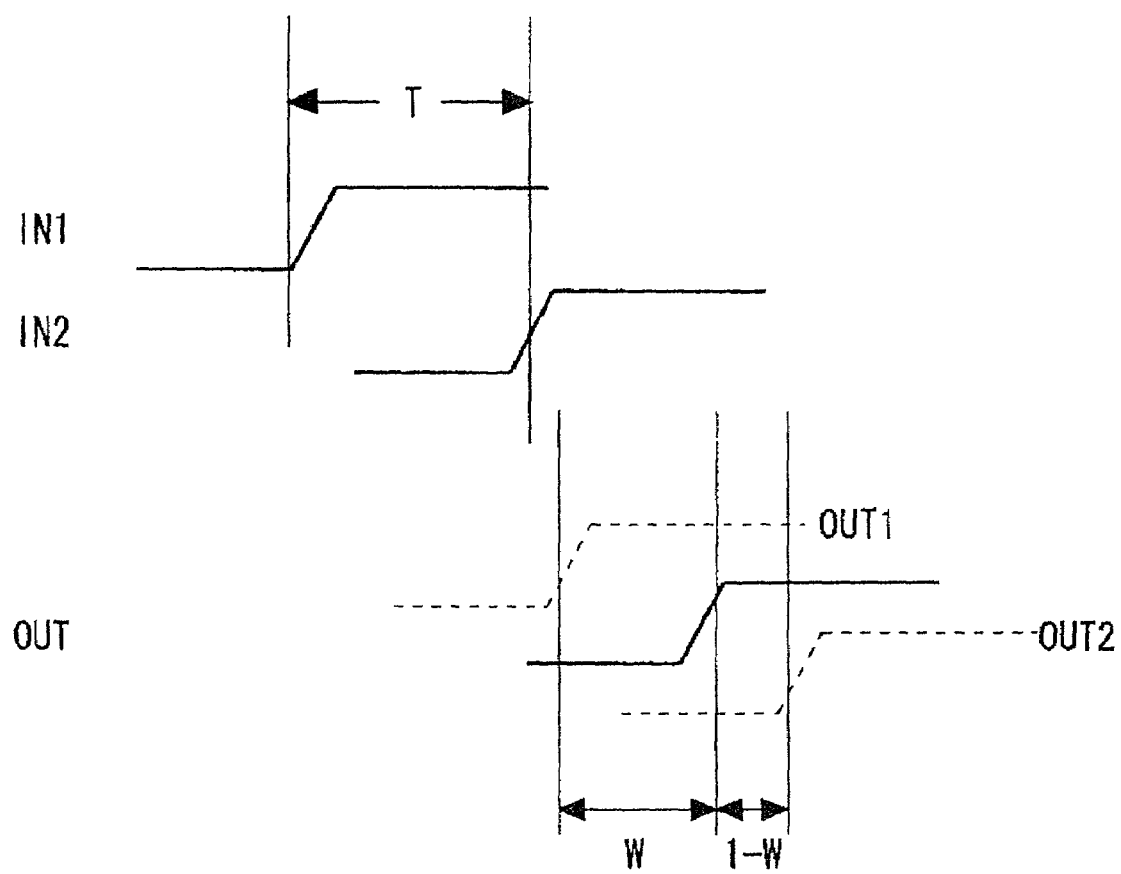
FIG. 5 is a timing waveform diagram for illustrating the operating principle of the interpolator in a phase shifting circuit according to an embodiment of the present invention.

FIG. 4 shows the circuit configuration of the interpolator 111 shown in FIG. 2. FIG. 5 shows the operation of the interpolator of FIG. 4. Referring to FIGS. 4 and 5, the interpolator generates an output OUT having a delay time prescribed by the time obtained with interior division by w:1-w of an interval between an output signal OUT1 having a delay time when the input signal IN1 is entered to the two inputs and an output signal OUT2 having a delay time when the input IN2 is entered to the two inputs. The interpolator includes CMOS inverters INV1, and INV2, receiving the inputs IN1, IN2 respectively and having the delay time being varied, an inverter 3, an input of which is connected to a common connection node (node N1) of the output of the inverters INV1, and INV2, and N-channel MOS transistors MNA1 to MNA8 and capacitors C0 to C7 connected in series between the node N1 and the ground. The N-channel MOS transistors MNA1 to MNA8 are turned on or off by the control signal Cnt[0:7] fed to the gates of the N-channel MOS transistors MNA1 to MNA8 to determine the value of the capacitance annexed to the node N1. Meanwhile, the capacitance values of the capacitances C0 to C7 may be set to values corresponding to powers of 2, such as twice, four times, eight times and 16 times, with the C0 as reference. In this case, the W/L ratio (or gate width) of the N-channel MOS transistors MNA1 to MNA8 has such a size that conforms to the capacitance value of the corresponding capacitance.

The control signal Cnt[0:7] may be set by an output of a frequency detection circuit which detects the frequency of the clock signal. Alternatively, the control signal Cnt[0:7] may be determined by setting the resistor or the dip switches to a desired value depending on the application. The frequency range that can be coped with may be enlarged by varying the capacitance value appended to the node N1 by the control signal Cnt[0:7].

Figure 6:
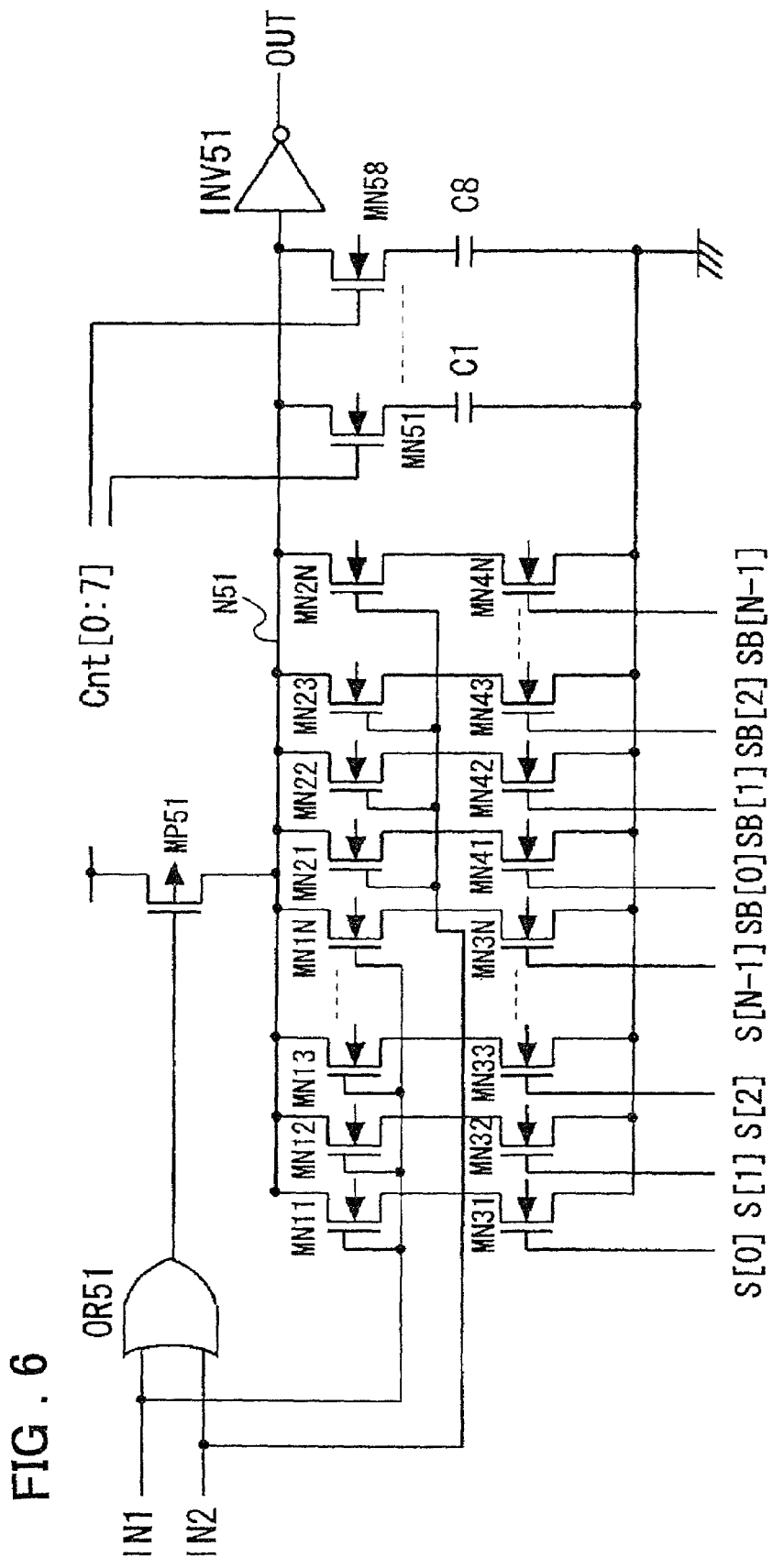
FIG. 6 shows an illustrative structure of an interpolator in a phase shifting circuit according to an embodiment of the present invention.

FIG. 6 shows an schematic structure drawn at a transistor level of the interpolator 111 shown in FIG. 2. Referring to FIG. 6, the interpolator includes a P-channel MOS transistor MP51 which is connected across the power supply VDD and an internal node N51 and is turned on when an output signal from an logic OR circuit OR51 receiving the inputs IN1 and IN2 is at a low level. A plural number of series circuits of N-channel MOS transistors and capacitors (MN51-C1, . . . , MN58-C8) are connected across the internal node N51 and the ground, whilst an inverter INV51 has an internal node N51 connected to an input terminal and has an output terminal from which an output signal OUT is output. The control signal Cnt[0:7], which are connected to the gates of the N-channel MOS transistors MN51 to MN58, may be set by an output of the frequency detection circuit, not shown, adapted for detecting the frequency of the clock signal, or may be determined by setting e.g., registers or dip switches to desired values depending on applications. By varying the capacitance values connected to the node N51 by the control signal Cnt[0:7], it is possible to enlarge the frequency range that can be coped with.

The interpolator also includes 2N pieces of N-channel MOS transistors MN11 to MN1N and MN21 to MN2N, the drains of which are connected to the internal node N51 and which are connected in parallel with one another, and 2N pieces of N-channel MOS transistors MN31 to MN3N and MN41 to MN4N, the drains of which are connected to the sources of the 2N N-channel MOS transistors MN11 to MN1N and MN21 to MN2N and the sources of which are connected to the ground. The gates of one half N of the 2N N-channel MOS transistors MN11 to MN1N are connected to the input signal IN1, in common, while the gates of the remaining half N of the 2N N-channel MOS transistors MN11 to MN1N are connected, in common, with the input signal IN2.

By the control signal (N bits control code) S[0] to S[N–1] and the control signal (N bits control code) SB[0] to SB[N–1], input to the gates of the N-channel MOS transistors MN31 to MN3N and MN41 to MN4N, a preset number of the N-channel MOS transistors MN31 to MN3N and MN41 to MN4N are turned on. The N-bits control signal S[0:N–1] and SB[0:N–1] are provided from the decoder 106, while SB[0] to SB[N–1] are given as complementary signals obtained on inverting S[0] to S[N–1] by the inverters(as shown by an inverter INV of FIG. 3).

Referring to FIG. 6, the operation of the present interpolator is explained. When the inputs IN1, IN2 are both at a low level, the P-channel MOS transistor MP51, which receives at its gate an output of the OR circuit 51 is turned on to charge the capacitor C with the current from the power supply. The capacitance value of the capacitor C is the sum of the capacitance values of the capacitors which are connected to the N-channel MOS transistors MN51 to MN58 and which are set ON by the control signal Cnt among the capacitor C1 to C8.

At the time of a rise transition from a low level to a high level of the signal applied to the input IN1, the N-channel MOS transistors MN11 to MN1N are turned on. Through a path of n pieces of N-channel MOS transistors, which are turned on by the control signal, among the N-channel MOS transistors MN31 to MN3N, the drains, sources and gates of which are connected to the sources of the N-channel MOS transistors MN11 to MN1N, to the ground and to the control signals S[0] to S[N–1], respectively, the charge stored in the capacitor C is partially discharged.

At the time of a rise transition from a low level to a high level of t the input IN2, with a delay from the rise transition of the input IN1, the N-channel MOS transistors MN21 to MN2N are turned on. Through a path of N–n pieces of N-channel MOS transistors, which are turned on by the control signal, among the N-channel MOS transistors MN41 to MN4N, the drains, sources and gates of which are connected to the sources of the N-channel MOS transistors MN11 to Mn1N, to the ground and to the control signals SB[0] to SB[N–1], respectively, the charge stored in the capacitor C is partially discharged.

The electric charge to be discharged until the output of the inverter INV51 receiving the terminal voltage of the capacitor C is inverted to a high level is assumed to be CV. The electric charge is discharged with the current nI during the phase difference T as from a transition of the input IN1 to a high level. The input IN2 then goes to a high level. The electric charge then is discharged with the drain current NI of n N-channel MOS transistors MN11 to MN1n and (N–n) N-channel MOS transistors MN21 to MN2(N–n), i.e., total N pieces of N-channel MOS transistors. The time delay from the rise of the input IN2 from the low level to the high level to the rise of the output OUT is given as $$(CV-n\cdot I\cdot T)/NI = CV/NI - n\cdot T/N \tag{1}$$

The delay time can be variably set with a unit of the N division of the phase difference T between the inputs IN1 and IN2.

In FIG. 6, N-channel MOS transistors MN11 to MN1N and MN21 to MN2N, and 2N N-channel MOS transistors MN31 to MN3N and MN41 to MN4N may be arranged in the reverse positions. For example, drains of N-channel MOS transistors MN31 to MN3N and MN41 to MN4 are connected to the internal node N51 and drains of N-channel MOS transistors MN11 to MN1N and MN21 to MN2N, sources of which are connected to the ground, are connected respectively to sources of N-channel MOS transistors MN31 to MN3N and MN41 to MN4.

According to the present invention, the multi-phase clocks may be generated from a voltage-controlled oscillator (VCO) of the PLL. In this case, clocks are taken from the inversion circuit of a preset stage of the ring oscillator of the VCO. Alternatively, a multi-phase clock multiplier circuit may generate the multi-phase clocks.

Figure 7:
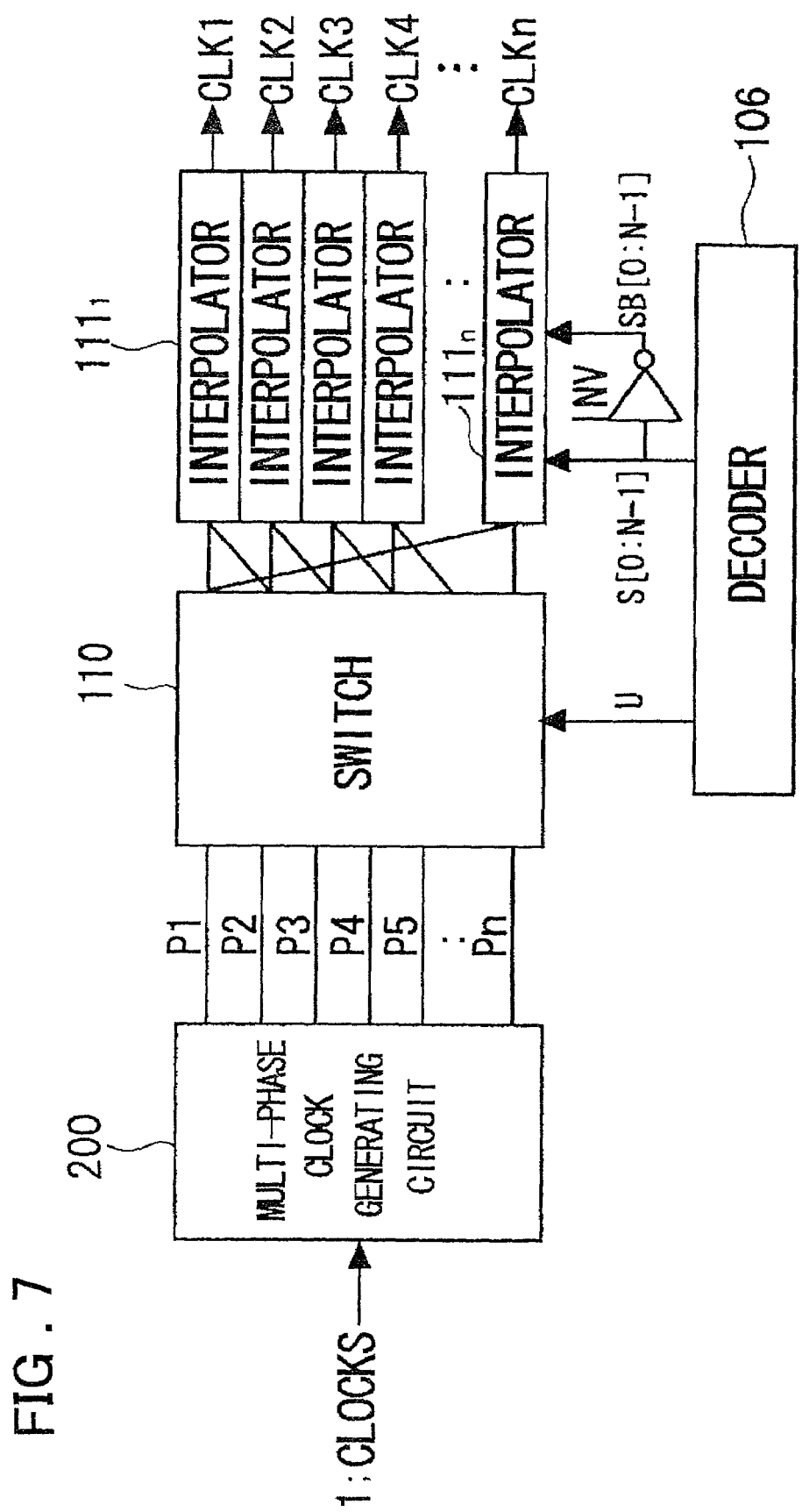
FIG. 7 shows an illustrative structure in case of employing an output of a multi-phase clock generating circuit as an input of the phase shifting circuit in an embodiment of the present invention.

FIG. 7 shows a configuration for generating the multi-phase clocks, supplied to the phase shift circuit 101, using a multi-phase clock generating circuit 200 employing a multiplier interpolator (multi-phase clock multiplier circuit). The phase shift circuit 101 of FIG. 1a is made up of a multi-phase clock generating circuit 200 and a rotary switch 110. The interpolators $111_1$ to $111_n$ output clocks CLK1 to CLKn, where n=8, these clocks being fed to the clock input terminals of the D-flip-flop 102 of FIG. 1a(F/F1 to F/F8). In FIG. 7, reference clock generated by a clock generating circuit, such as a quartz oscillator, is used as a clock 1.

FIG. 8 shows an specified example of the structure of a four-phase clock multiplier circuit for generating four-phase clocks, as an example of the structure of the multi-phase clock generating circuit 200. Referring to FIG. 8, this four-phase clock multiplier circuit includes a ¼ frequency divider 201 for frequency dividing the input clock 205 by four to output four-phase clocks Q1 to Q4, n-stage cascaded four-phase clock multiplier circuits (termed also multiphase frequency doublers or MPFDs) $202_1$ to $202_n$ and a period detection circuit 204. The last stage four-phase clock multiplier circuit 202. outputs 2n-multiplied four-phase clocks Qn1 to Qn4. Meanwhile, the number of stages of the four-phase clock multiplier circuits is arbitrary. In this four-phase clock multiplier circuit, the four-phase clocks are rendered into eight phase by respective four-phase clock multiplier circuits 202 and are restored to the four phase to effect continuous multiplication. The eight-phase clocks (P21 to P28 of FIG. 10) generated by the last stage four-phase clock multiplier circuit $202_n$ may also be directly output, as will now be explained in detail.

Figure 9A:
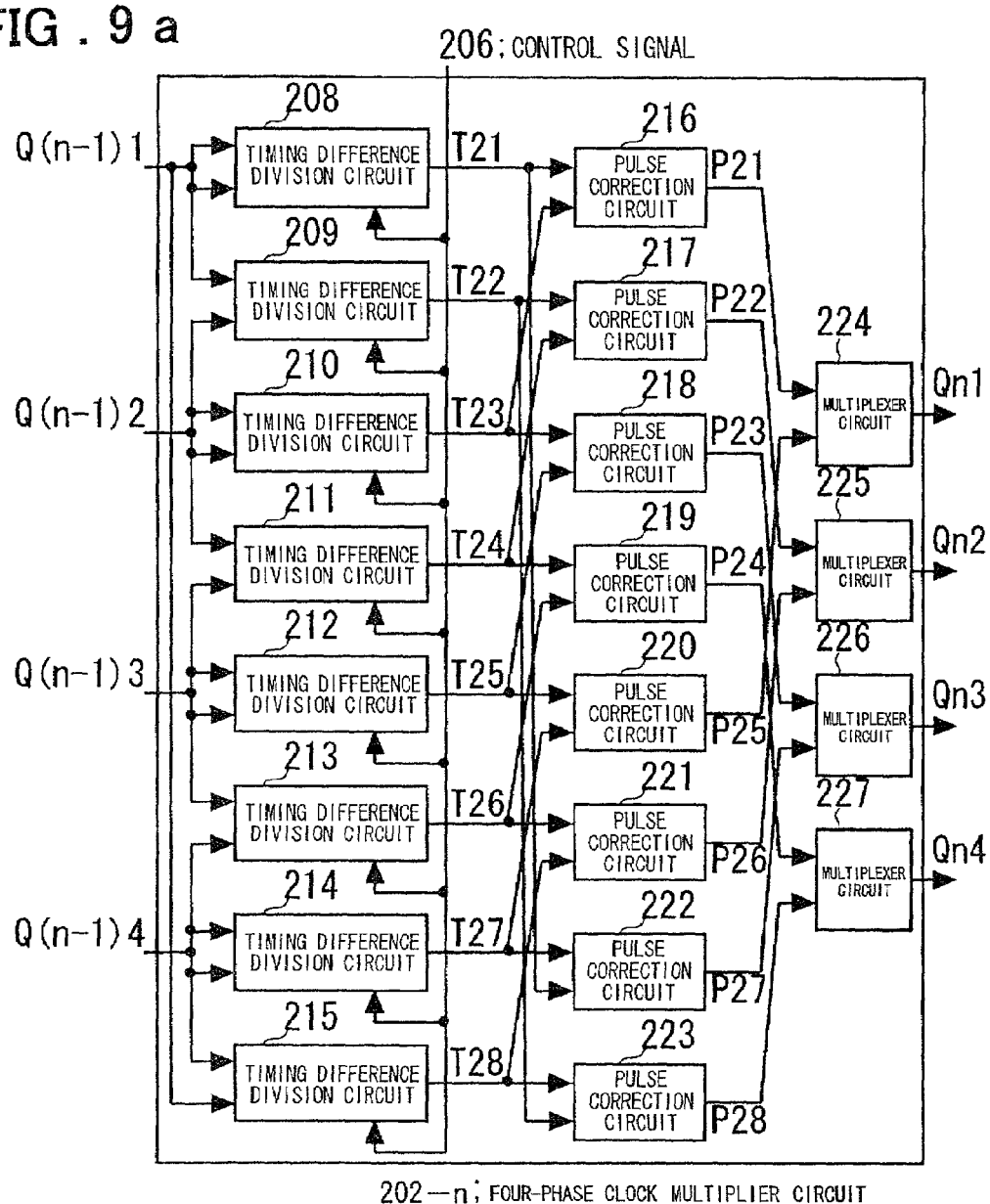
FIGS. 9a, 9b and 9c show an illustrative structure of a four-phase clock generating circuit according to an embodiment of the present invention.

FIG. 9a shows an illustrative structure of the four-phase clock multiplier circuit $202_n$ when the multi-phase clock multiplier circuit is arranged as the four-phase clock multiplier circuit. The four-phase clock multiplexer circuits $202_1$ to $202_n$ are of the same structure.

Referring to FIG. 9a, the four-phase clock multiplier circuit $202_n$ is made up of eight sets of timing difference division circuits 208 to 215, eight sets of pulse correction circuits 216 to 223 and four sets of multiplexer circuits 224 to 227. The timing difference division circuits 208 to 215 receive 4 phase clocks (Q(n−1)1-Q(n−1)4), divide the timing difference of two inputs, and output 8-phase output clocks. The odd number timing difference division circuits 208, 210, 212 and 214 receive as two inputs, with the same clocks of the n-phase clocks (Q(n−1)1 and Q(n−1)1, Q(n−1)2 and Q(n−1)2, Q(n−1)3 and Q(n−1)3, Q(n−1)4 and Q(n−1)4), with the even number timing difference division circuits 209, 211, 213 and 215 receive neighboring clock pairs of the n-phase clocks (Q(n−1)1 and Q(n−1)2, Q(n−1)2 and Q(n−1)3, Q(n−1)3 and Q(n−1)4, Q(n−1)4 and Q(n−1)1).

Figure 9B:
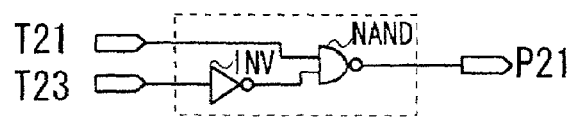
Figure 9C:
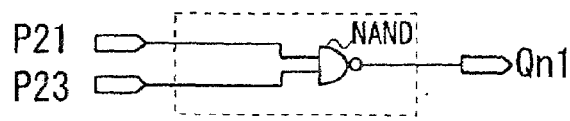

The number J pulse correction circuit, where $1 \leq J \leq 8$, receives an output of the number J timing difference division circuit as a first input, and an output of the number ((J+2) mod n) timing difference division circuit, where (J+2) mod n is the remainder obtained on dividing (J+2) by n, as a second input, while the number K multiplexer circuit, where $1 \leq K \leq 4$, receives an output of the number K pulse correction circuit and an output of the number (K+n) pulse correction circuit as an inputs. FIG. 9b shows the structure of the pulse correction circuit and the pulse correction circuit is made up of a NAND circuit receiving a signal which is obtained on inverting the second input T23 by the inverter INV and with the first input T21 as inputs. FIG. 9c shows the structure of a multiplexer circuit comprised of a two-input NAND circuit.

Figure 10:
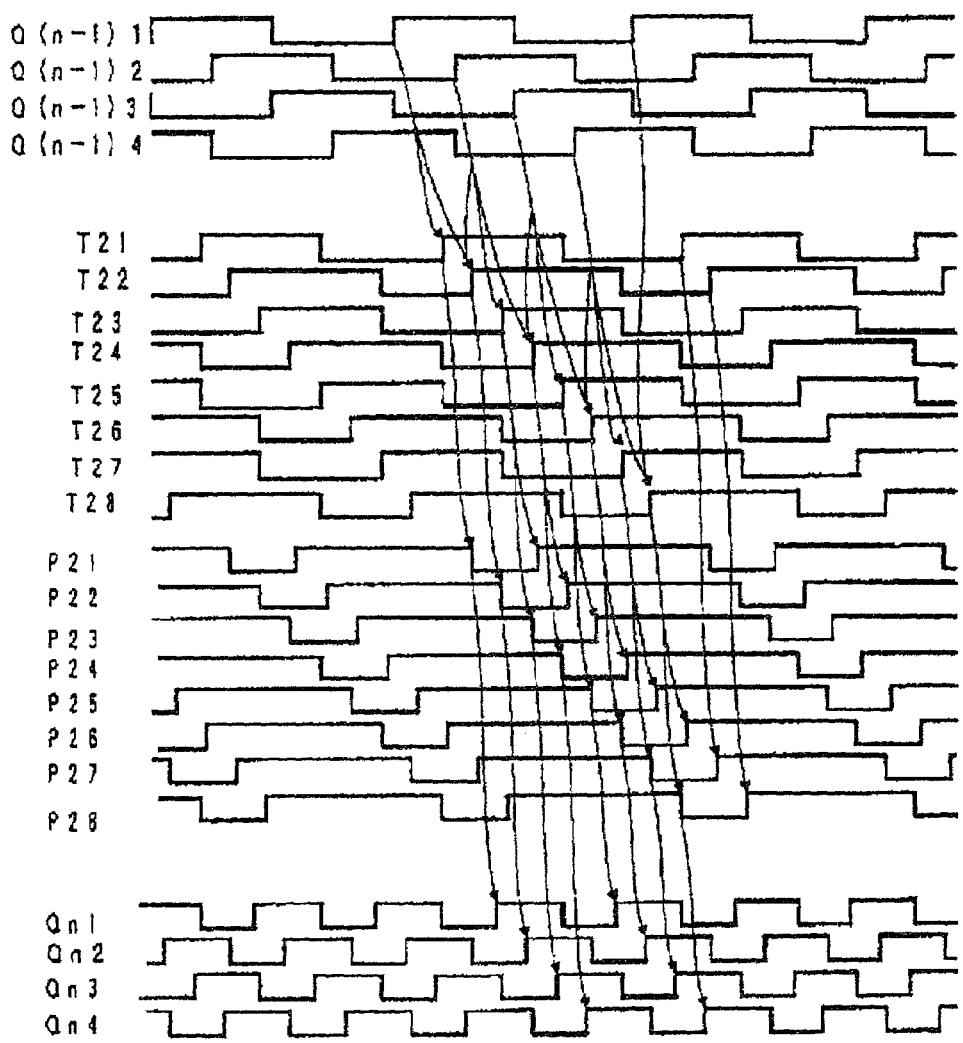
FIG. 10 shows the timing operation of a four-phase clock multiplexer circuit according to an embodiment of the present invention.

FIG. 10 is a signal waveform diagram showing the timing operation of the four-phase clock multiplier circuit 202 shown in FIG. 9a. The rising of a clock T21 is determined by the internal delay of the timing difference division circuit 208 as from the rising of the clock Q(n−1)1, the rising of a clock T22 is determined by the timing division of the timings of the rise of the clock Q(n−1)1 and the rise of the clock Q(n−1)2 by the timing difference division circuit 209 and by the internal delay, and the rising of a clock T23 is determined by the timing division of the timings of the rise of the clock Q(n−1)1 and the rise of the clock Q(n−1)2 by the timing difference division circuit 210 and by the internal delay. In similar manner, the rising of a clock T26 is determined by the timing division of the timings of the rise of the clock Q(n−1)3 and the rise of the clock (n−1)4 by the timing difference division circuit 213 and by the internal delay, the rising timing of a clock T27 is determined by the internal delay of the timing of the rise of the clock Q(n−1)4 in the timing difference division circuit 214 and the rising of a clock T28 is determined by the timing division of the timings of the rise of the clock Q(n−1)4 and the rise of the clock (n−1)1 by the timing difference division circuit 215 and by the internal delay.

The clocks T21 and T23, output by the timing difference division circuits 208, and 210, are input to the pulse correction circuit 216, which then outputs a pulse P21 having a falling edge determined by the clock T21 and a rising edge determined by the clock T23. In a similar sequence, pulses P22 to P28 are generated which are eight-phase pulses group, each of which has a duty of 25%, and has a phase shifted by 45° relative to one another. The clock P25, having a phase shifted by 180° relative to this clock P21, is multiplexed and inverted by a multiplexer circuit 224 and output as a 25 duty % clock Qn1. The clocks Qn1 to Qn4 are generated in similar manner. The clocks Qn1 to Qn4 are 50 duty % four-phase pulse set of pulses, out of phase by 90° from one another. The period of the clocks Qn1 to Qn4 is doubled in frequency in the process of generating the clocks Qn1 to Qn4 from the clocks Q(n−1) to Q(n−1)4.

That is, the eight-phase clocks P21 to P28 are generated from the four-phase clocks Q(n−1) to Q(n−1)4 to generate double-frequency four-phase clocks Qn1 to Qn4. Meanwhile, the eight-phase clocks P21 to P28 may be output from the last stage four-phase clock multiplexer circuit $202_n$ (see FIG. 8).

Figure 11:
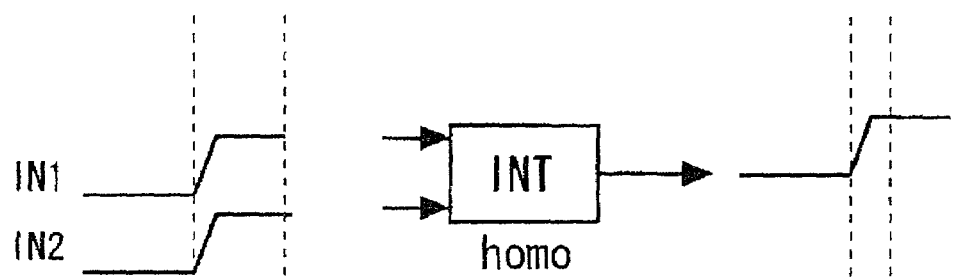
FIGS. 11a and 11b illustrate the operation of an interpolator of a four-phase clock multiplexer circuit according to an embodiment of the present invention.
Figure 11:
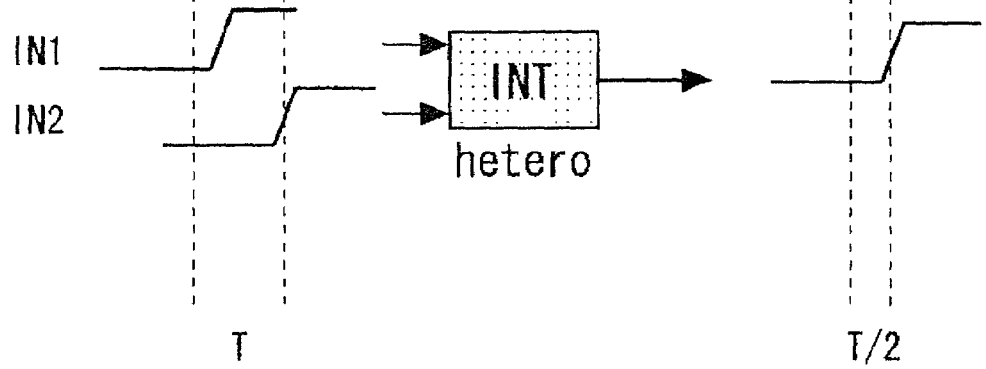

FIGS. 11a and 11b schematically show the operating principle of the timing difference division circuits 208, and 209. The timing difference division circuits 208, 210, 212 and 214 (homo), receiving the same signals, output signals with an inherent delay time, whereas the timing difference division circuits 209, 211, 213 and 215 (hetero), receiving two inputs exhibiting the phase difference T, output signals which undergo transition with a delay time corresponding to the sum of the delay time proper to the timing difference division circuit and time T/2 corresponding to one half the phase difference T (halved phase difference T).

Figure 12:
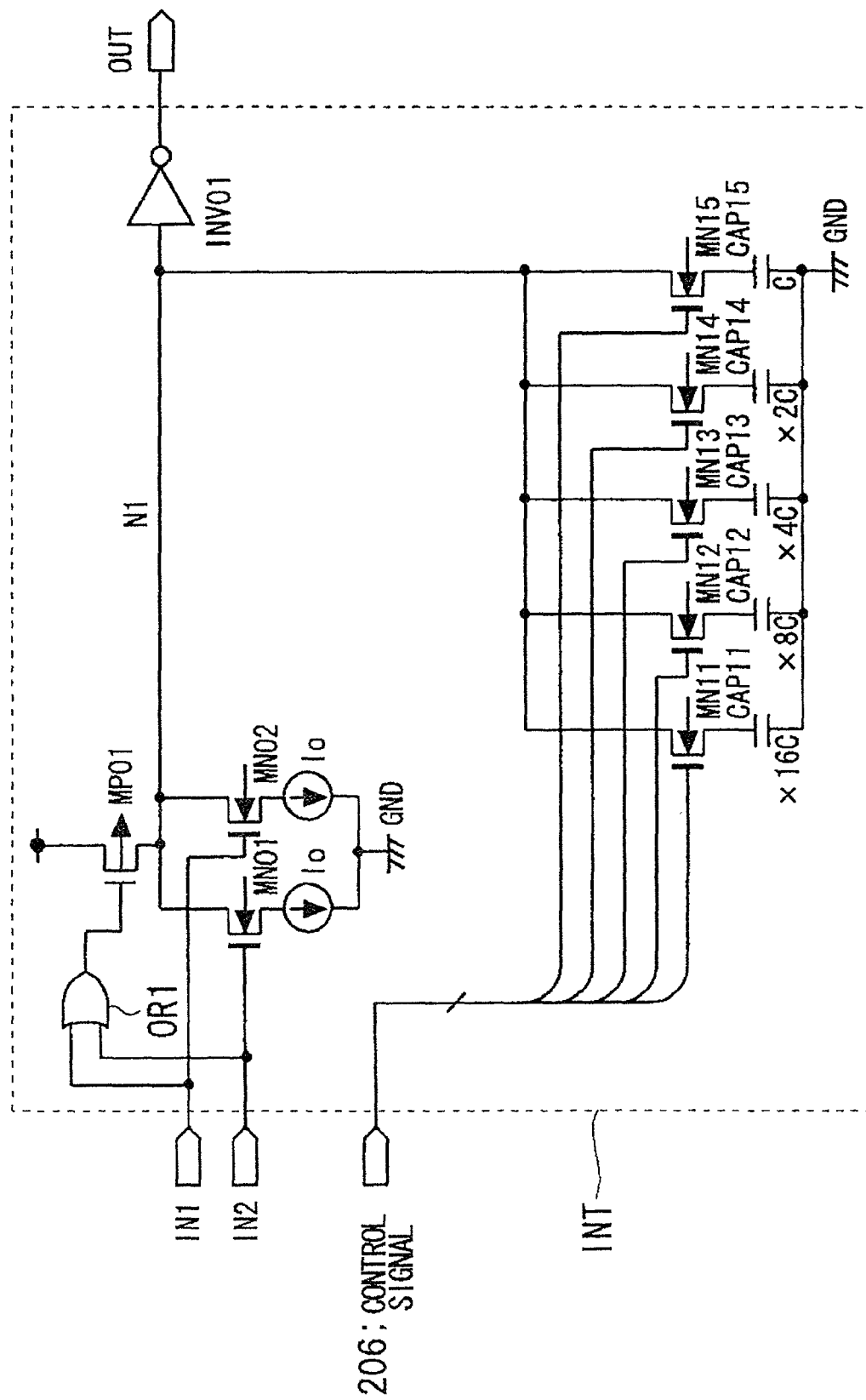
FIG. 12 shows an illustrative structure of an interpolator of a fourphase clock multiplexer circuit according to an embodiment of the present invention.
Figure 13:
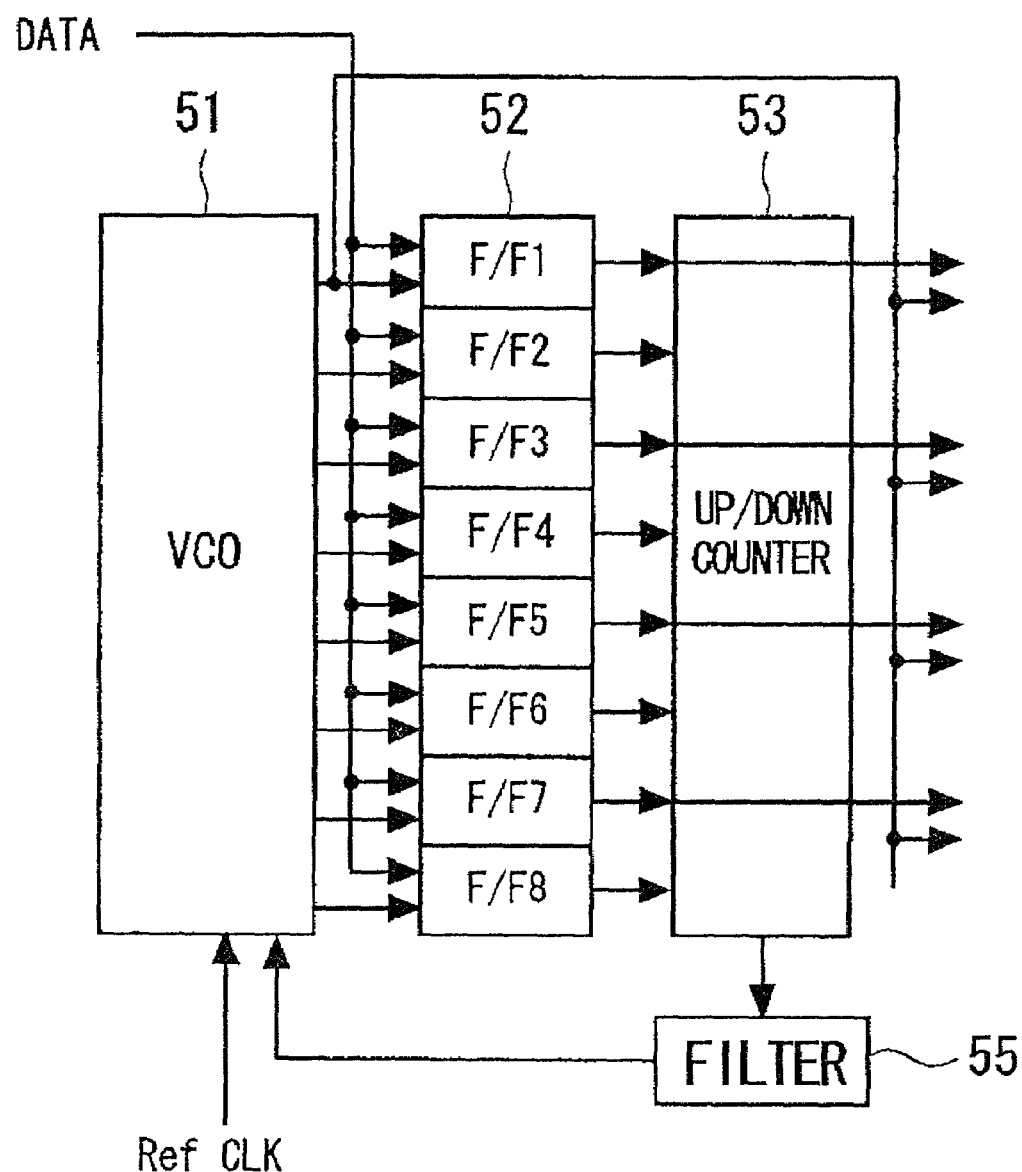
FIG. 13 shows an illustrative structure of a conventional clock and data recovery circuit.
Figure 14:
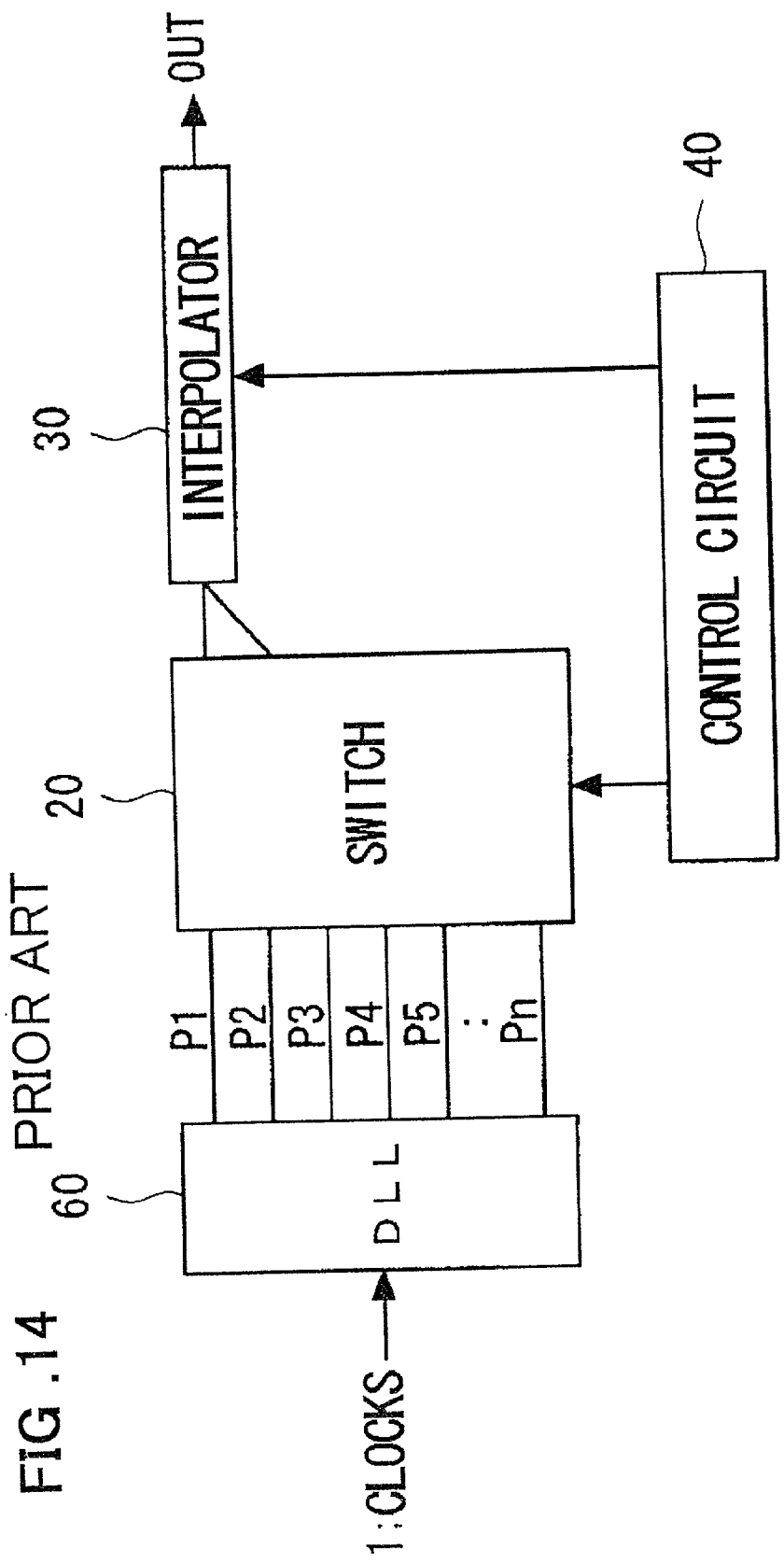
FIG. 14 shows a structure of a conventional clock control circuit.
Figure 15:
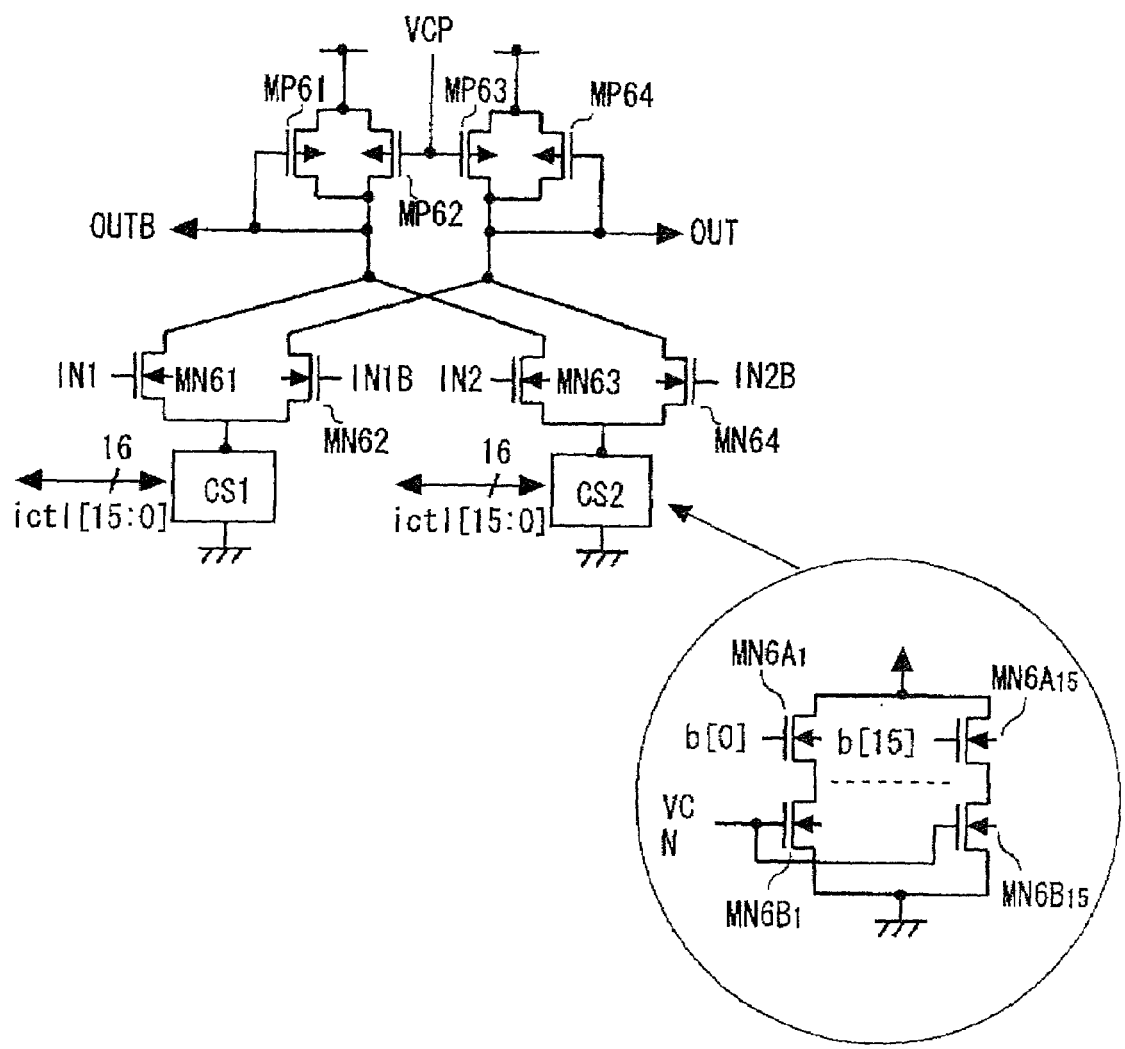
FIG. 15 shows a structure of a conventional phase interpolator.
Figure 16:
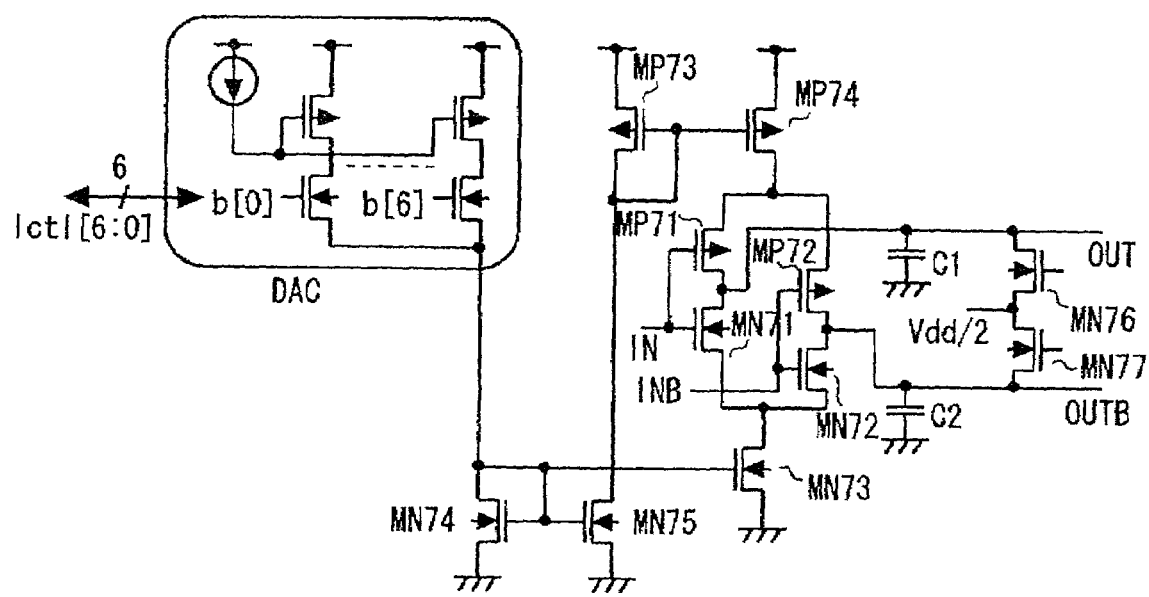
FIG. 16 shows a structure of a conventional phase interpolator. digital analog converter (DAC) constant current source transistor MP73 clock and data recovery circuit N-channel MOS transistors MN61, MN62.

FIG. 12 shows a typical structure of the timing difference division circuits 208, and 209. The timing difference division circuit 208 has its two inputs IN1 and IN2 supplied with the same signals, whilst the timing difference division circuit 209 is supplied with two neighboring signals. That is, the timing difference division circuit 208 has its two inputs IN1, and IN2 supplied with the same signals Q(n−1)1, whilst the timing difference division circuit 209 has its two inputs IN1 and IN2 supplied with Q(n−1)1 and Q(n−1)2. The structure of the timing difference division circuits, shown in FIG. 12, comprises a P-channel MOS transistor MP01, having its source and drain connected to a power supply VDD and to the internal node N1, an OR circuit OR1, receiving the input signals IN1 and IN2 and having its output connected to the gate of the P-channel MOS transistor MPO1 and N-channel MOS transistors MN01 and MN01, having drains connected to an internal node N1, sources connected to the ground via constant current source 10 and gates supplied with input signals IN1 and IN2. The internal node N1 is connected to an input terminal of the inverter INV01. The structure of the timing difference division circuits, shown in FIG. 12, also includes, across the internal node N1 and the ground, are connected in parallel, a circuit made up of an N-channel MOS transistor MN11 and a capacitor CAP11 serially connected, a circuit made up of an N-channel MOS transistor MN12 and a capacitor CAP12 serially connected, . . . and a circuit made up of an N-channel MOS transistor MN15 and a capacitor C5P12 serially connected. The gates of the N-channel MOS transistors MN11, MN12, . . . and MN15 are supplied with a control signal 206 of a 5-bits width from the period detection circuit 204 designed for detecting the period of the input clock for turning the N-channel MOS transistors on and off. The size ratio of the gate width of the N-channel MOS transistors MN11 to MN15 and the capacitance of the capacitor CAP11 to CAP15 is set to, for example, 16:8:4:2:1, so that, based on the control signal 206 output from the period detection circuit 204 (FIG. 8), the load connected to the common node can be adjusted to 32 steps to set the clock period.

As for the timing difference division circuit 208, the charge at the node N1 is discharged through the two N-channel MOS transistors MN11 and MN12 by the rising edge of the clock Q(n−1)1, commonly supplied to the two inputs IN1 and IN2 thereof. When the electric potential of the node N1 reaches the threshold voltage of the inverter INV01, the clock T21, output by the node N1, rises. If the charge at the node N1, that need to be extracted until the threshold value of the inverter INV01 is reached, is CV, where C and V denote the capacitance and the voltage, respectively, and the discharge current by the N-channel MOS transistor is I, the charge CV is discharged with a constant current of 2I as from the rising of the clock Q(n−1)1. So, the time CV/2I represents the timing difference from the rising edge of the clock Q(n−1)1 until the rising of the clock T21 (propagation delay time).

When the clock Q(n−1)1 is at a low level, the P-channel MOS transistor MP01 is turned on, the node N1 is charged to a high level and the output clock T21 of the inverter INV01 goes to a low level.

As for the timing difference division circuit 209, charge at node N1 is extracted during the time after time tCKn (=multi-phase clock period) as from the rising edge of the clock Q(n−1)1. When the potential of the node N1 has reached the threshold voltage of the inverter INV01, as from the rising edge of the clock Q(n−1)2 after time tCKn, the edge of the clock T22 rises. If the charge at the node N1 are CV and the discharge current of the NMOS transistor is I, the charge CV is extracted as from the rising of the clock Q(n−1)1 during the time tCKn with the constant current I, while being extracted during the remaining period with the constant current 2I. As a result, the time $$tCKn+(CV-tCKn\cdot I)/2I=CV/2I+tCKn/2 \quad (2)$$

represents the timing difference from the rising edge of the clock Q(n−1)1 to the rising edge of the clock T22.

That is, the timing difference between the rising of the clock T22 and the rising of the clock T21 is tCKn/2.

When the clocks Q(n−1)1 and Q(n−1)2 both go to a low level, and the node N1 is charged through the P-channel MOS transistor MP01 from the power supply to a high level, the clock T22 falls. The same applies for the clocks T22 to T28, and the timing difference of the clocks T21 to T28 is equal to tCKn/2.

The pulse correction circuits 216 to 223 generate duty-25% eight-phase pulses P21 to P28, each phase of which is shifted by 45° from one another (see FIGS. 9a, 9b, 9c and 10).

The multiplexer circuits 224 to 227 generate duty 50% four-phase pulses Qn1 to Qn4, each phase of which is shifted by 90° from one another (see FIGS. 9a, 9b, 9c and 10).

The timing difference division circuit shown in FIG. 12 is suitably changed depending on the application used. For example, it is possible to provide an output signal of a NAND circuit which receives the first and second input signals IN1 and IN2, to the gate of the P-channel MOS transistor MP01 and to provide the signals which are obtained on complementing the first input signal IN1 and the second input signal IN2 by the inverter, to the gates of the N-channel MOS transistors MN01 and MN02. In this case, when the first and second input signals IN1 and IN2 are at a high level, the P-channel MOS transistor MP01 is turned on to charge the internal node N1, with the output of the inverter INV01 going to a low level. When one or both of the first and second input signals IN1 and IN2 are at a low level, the P-channel MOS transistor MP01 is turned off, and one or both of the P-channel MOS transistors MN01 and MN02 is turned on to discharge the internal node N1. When the voltage of the internal node N1 falls to below the threshold value of the inverter INV01, the output of the inverter INV01 rises to a high level.

The meritorious effects of the present invention are summarized as follows.

According to the present invention, as described above, the frequency range can be modified readily to facilitate adjustment of characteristic values. The reason is that in accordance with the, present invention, changes in the frequency can be coped with by varying the value of the capacitance added to the internal node of the interpolator forming a phase shift circuit designed for shifting the phase of the multi-phase clocks and for outputting the so phase-shifted clocks.

Moreover, according to the present invention, in which the selection circuit is provided, there may be derived an advantage that it is possible to variably set the parallel number in the clock and data recovery circuit.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A clock and data recovery circuit comprising:
a phase-shifting circuit for supplying phase-shifted clocks to a plural number of latch circuits, receiving an input data in common, for sampling the input data with transition edges of said phase-shifted clocks, said phase-shifted clocks being supplied respectively to said latch circuits from said phase-shifting circuit, for outputting sampled data;
a phase detection circuit for producing a detected phase of a transition point of said input data associated with said phase-shifted clocks from outputs of said plural latch circuits and for outputting the detected phase;
a filter for smoothing an output of said phase detection circuit; and
a decoder for decoding an output of said filter;
a circuit for controlling the phase of said phase-shifted clocks based on an output of said filter; said clock and data recovery circuit recovering clocks and data based on the input data;
wherein said phase-shifting circuit includes:
a switch, receiving a plural number of input clocks having respective different phases, for selecting at least two sets of clock pairs from said input clocks; and
a plural number of interpolators, receiving said at least two sets of clock pairs, output from said switch, each interpolator outputting a signal having a delay time which is prescribed by a time corresponding to an interior division of a phase difference of said clock pair;
wherein each of said interpolators includes:
a charge circuit for turning a charging path and a discharging path of a capacitor on and off depending on logic values of said clock pairs; and
a buffer circuit for varying an output logic value when a magnitudes relation between a terminal voltage of said capacitor and a threshold value are inverted;
wherein a capacitance value of said capacitor is variably set by a control signal for determining the capacitance value; and output signals of said at least two interpolators are fed as said phase-shifted clocks to said latch circuits; and
wherein switching selections of said clock pairs in said switch are controlled based on an output signal of said decoder, and an interior division ratio of said plural interpolators is variably set to control the phase of clocks supplied to said plural latch circuits.

2. The clock and data recovery circuits as defined in claim 1 further comprising
a selection circuit receiving all or part of outputs of said plural latch circuits to select outputs to be output as output data.

3. A clock and data recovery circuit comprising:
a switch receiving a plural number of input clocks having respective different phases, for outputting at least two sets of clock pairs therefrom;
a plural number of interpolators, receiving a plural number of sets of clock pairs, output from said switch, each interpolator outputting a signal having a delay time which is prescribed by a time corresponding to an interior division, of a phase difference of said clock pair;
a plural number of latch circuits for latching input data based on output signals output from said interpolators;
a counter circuit for increasing or decreasing an output value based on output logic values of said plural latch circuits;
a filter for averaging an output of said counter circuit for a predetermined time period;
a decoder for decoding an output of said filter; and
a selection circuit receiving a set of data output from said plural latch circuits and clocks output from a preset one of said interpolators, said selection circuit selecting data to be output to output the selected data along with said clocks for varying a parallel number of the output data and the clocks;
wherein switching selections of clock pairs in said switch are controlled based on an output signal of said decoder, and an interior division ratio of said plural interpolators is variably set to control the phase of clocks supplied to said plural latch circuits.

4. The clock and data recovery circuit as defined in claim 3 wherein said counter circuit is made up of a charge pump circuit for charging and discharging a capacitor with an upcounting signal and with a downcounting signal, respectively, said upcounting signal and said downcounting signal being first and second logic values of said output of said latch circuit, an output voltage of said charge pump circuit being fed to said filter.

5. The clock and data recovery circuit as defined in claim 3 wherein said counter circuit is made up of an up/down counter and wherein a digital output of said counting circuit is input to said filter of a digital filter circuit.

6. A clock and data recovery circuit comprising:
a switch receiving a plural number of input clocks having respective different phases, for outputting at least two sets of clock pairs therefrom;
a phase shift circuit including a plural number of interpolators receiving a plural number of sets of clock pairs output from said switch, said interpolators outputting output clocks having a delay time which is prescribed by a time corresponding to an interior division of a phase difference of said received clock pair with a given control signal;
a plural number of flip-flops for sampling input data with clocks output from said plural interpolators and for outputting the resulting sampled data;
a counter receiving a plural number of outputs of said flip-flops for upcounting or downcounting depending on logic values of said outputs of said flip-flops;
a filter for time averaging a count output from said counter; and
a decoder for decoding an output of said filter;
said decoder outputting a switching signal for switching between combinations of clock pairs in said switch based on a decoded result of the output from said filter, said switching signal varying an interior division ratio in said plural interpolators; and
a selection circuit receiving plural sets of part or all of said outputs of said plural flip-flops and said clocks output from said first interpolator to render a parallel number of output data and clocks selectable.

7. The clock and data recovery circuit as defined in claim 6 wherein
the counter for counting outputs of said plural flip-flops is made up of a charge pump circuit for charging and discharging a capacitor with an upcounting signal and with a downcounting signal, said upcounting signal and said downcounting signal being first and second logic values of said output of said latch circuit, respectively, and an output of said charge pump circuit being supplied to said filter.

8. The clock and data recovery circuit as defined in claim 6 wherein said interpolator includes:
a circuit for turning a charging path and a discharging path of a capacitor on and off depending on values of said input clock pairs, and
a buffer circuit for changing an output logic value when a magnitudes relation between the terminal voltage of said capacitor and a threshold value are inverted;
wherein a capacitance value of said capacitor is variably set by a control signal for determining the capacitance value.

9. The clock and data recovery circuit as defined in claim 6 wherein
each of said interpolators includes a logic circuit having first and second input terminals for receiving first and second input signals therefrom;
a switch inserted across a first power supply and an internal node and turned on when an output of said logic circuit is of a first logic value; and
a buffer circuit having its input terminal connected to said internal node and having an output logic value inverted on an inversion of a magnitudes relation between said internal node voltage and a threshold value;
N pieces of second switches connected in parallel, each having one end connected to said internal node, and having a control terminal supplied with said first input signal from said first input terminal;
N pieces of third switches connected in parallel, each having one end connected to said internal node, and having a control terminal supplied with said second input signal from said second input terminal;
N pieces of fourth switches, connected in parallel across the other end of said second switch and a second power supply and each having a control terminal supplied with a control signal from said decoder so as to be turned on or off;
N pieces of fifth switches, connected in parallel across the other end of said third switch and the second power supply and each having a control terminal supplied with a control signal from said decoder so as to be turned on or off and
a plural number of serial circuits inserted across said internal node and said second power supply and each being made up of a sixth switch and capacitor;
said sixth switch being turned on or off by a capacitance value determining control signal supplied to a control terminal of said sixth switch to variably control the capacitance value of the capacitor connected to said internal node.

10. The clock and data recovery circuit as defined in claim 6 wherein said decoder sets the interior division ratio of said interpolator based on a time-averaged value of an output of said counter by said filter; and wherein
if the upper or lower setting value of said interpolator is reached, and it is still necessary to perform adjustment for further advancing or delaying the phase of the output signal of said interpolator, a switching signal for switching the clock pair combinations is provided to said switch adapted for selectively outputting clocks to be supplied to said interpolator.

11. The clock and data recovery circuit as defined in claim 6 wherein
said multi-phase clocks are supplied from a voltage controlled oscillator of a phase locked loop (PLL).

12. The clock and data recovery circuit as defined in claim 6 wherein
said multi-phase clocks are supplied from a multi-phase clock generating circuit; said multi-phase clock generating circuit including:
a frequency divider for frequency dividing an input clock to generate multi-phase clocks having respective different phases;
a period detection circuit for detecting the period of said input clock; and
one or a plural number of multi-phase clock multiplexer circuits arranged in one or plural cascaded stages, receiving clocks of a plural number of phases (n phases) output by said frequency divider, and generating clocks obtained by a frequency multiplication of said received clocks;
said multi-phase clock multiplexer circuits receiving n-phased clocks (first to number n clocks) comprising:
2n pieces of timing difference division circuits outputting a signal corresponding to a division of a timing difference of two inputs;
odd-number timing difference division circuits (number (2I−1) timing difference division circuit, where $1 \leq I \leq n$) receiving the same clock being the number I among the n-phased clocks, as said two inputs;
even-number timing difference division circuits (number 2I timing difference division circuit, where $1 \leq I \leq n$), receiving the number I and number (I+1) clocks among the n-phased clocks, where number (n+1) clock circulates to number 1 clock;
2n pieces of pulse correction circuits; wherein the number J pulse correction circuit, where $1 \leq J \leq 2n$, receives as a first input an output of the number J timing difference division circuit, while receiving as a second input an output of the number ((J+2) mod n) timing difference division circuit, where (J+2) mod n is a remainder obtained on dividing (J+2) with n; said number J pulse correction circuit outputting a NAND operation of said first input and a complemented signal of said second input;
n pieces of multiplexing circuits, with the number K multiplexing circuit, where $1 \leq K \leq n$, receiving an output of the number K pulse correction circuit and with an output of the number (K+n) pulse correction circuit to output NAND thereof.

13. The clock and data recovery circuit as defined in claim 12 wherein said timing difference division circuit includes:
a logic circuit receiving signals from first and second input terminals as inputs to output results of preset logical operation of said first and second input signals;
a first switching device connected across said first power supply and the internal node for receiving an output signal of said logic circuit at a control terminal thereof
a buffer circuit having its input terminal connected to said internal node for switching a logic output value on switching of the magnitudes relation between said internal node potential and a threshold value;
a second switching device connected across said internal node and a second power supply and turned on or off based on the value of a signal from said first input terminal; and
a third switching device connected across said internal node and the second power supply and turned on or off based on the value of a signal from said second input terminal;
wherein a plural number of serial circuits, each comprised of a fourth switch and capacitor, are connected across said internal node and said second power supply; said fourth switch device being controlled on or off by the value of the period control signal supplied to a control terminal of said fourth switch device to determine the value of the capacitance connected to said internal node.

14. The clock and data recovery circuit as defined in claim 6 wherein each of said interpolators includes a logic circuit having first and second input terminals for receiving first and second input signals therefrom;

a switch inserted across a first power supply and an internal node and turned on when an output of said logic circuit is of a first logic value; and a buffer circuit having its input terminal connected to said internal node and having an output logic value inverted on inversion of the magnitudes relation between said internal node voltage and a threshold value;

there being also provided N pieces of second switches connected in parallel, each having one end connected to said internal node, and having a control terminal supplied with a control signal from said decoder so as to be turned on or off;

N pieces of third switches connected in parallel, each having one end connected to said internal node, and having a control terminal supplied with a control signal from said decoder so as to be turned on or off N pieces of fourth switches, connected in parallel across the other end of said second switch and a second power supply and each having a control terminal supplied with said first input signal from said first input terminal;

N pieces of fifth switches, connected in parallel across the other end of said third switch and the second power supply and each having a control terminal supplied with said second input signal from said second input terminal; and a plural number of serial circuits inserted across said internal node and said second power supply and each being made up of a sixth switch and capacitor;

said sixth switch being turned on or off by a capacitance value determining control signal supplied to a control terminal of said sixth switch to variably control the capacitance value of the capacitor connected to said internal node.

15. A clock control method for use in a clock and data recovery circuit including a plural number of latch circuits receiving input data in common; said latch circuits sampling the input data with transition edges of clock signals having phases shifted from one another, said clock signals supplied respectively to said latch circuits to output the sampled data;

a phase detection circuit for detecting a phase of a transition point of said input data associated with the clocks from outputs of said plural latch circuits and for outputting the detected phase;

a filter for smoothing an output of said phase detection circuit; and a circuit for controlling the phase of said clocks based on an output of said filter; said clock and data recovery method recovering the clocks and data based on the input data; comprising the steps of:

selecting a switch, receiving a plural number of input clocks having respective different phases for selecting at least two sets of clock pairs from said input clocks;

with a plural number of interpolators receiving from said at least two sets of the clock pairs output from the switch, outputting a signal having a delay time which is prescribed by a time corresponding to an interior division of the phase difference of said paired clocks;

switching of selection of clock pairs in said switch being controlled based on an output signal of a decoder decoding the output of said filter; an interior division ratio of said interpolator being variably set to vary the phase of the clocks supplied to said plural latch circuits;

varying the capacitance value of each of said interpolators, having a charge circuit for turning a charging path and a discharging path of a capacitor on and off depending on logic values of said clock pairs; and a buffer circuit for varying an output logic value when a magnitudes relation between a terminal voltage of said capacitor and a threshold value is changed.

16. The clock control method as defined in claim 15 wherein data that can be output as output data is made selectable from all or part of outputs of said plural latch circuits obtained on sampling said input data by the transition edges of phase shifted clocks.

* * * * *